United States Patent
Seliskar

(10) Patent No.: US 7,439,139 B2
(45) Date of Patent: Oct. 21, 2008

(54) FULLY-DEPLETED CASTELLATED GATE MOSFET DEVICE AND METHOD OF MANUFACTURE THEREOF

(76) Inventor: John J. Seliskar, 1410 Minor Ridge Ct., Charlottesville, VA (US) 22901

( * ) Notice: Subject to any disclaimer, the term of this patent is extended or adjusted under 35 U.S.C. 154(b) by 49 days.

(21) Appl. No.: 11/728,111

(22) Filed: Mar. 23, 2007

(65) Prior Publication Data

US 2007/0218635 A1    Sep. 20, 2007

Related U.S. Application Data

(62) Division of application No. 10/940,093, filed on Sep. 13, 2004, now Pat. No. 7,211,864.

(51) Int. Cl.
H01L 21/336 (2006.01)
(52) U.S. Cl. .................. 438/284; 438/296; 438/151; 257/E21.19
(58) Field of Classification Search .......... 438/151–166, 438/284, 296; 257/E21.19
See application file for complete search history.

(56) References Cited

U.S. PATENT DOCUMENTS 6,413,802 B1 * 7/2002 Hu et al. ............. 438/151
6,720,619 B1 * 4/2004 Chen et al. .......... 257/347
7,211,864 B2 * 5/2007 Seliskar ............... 257/347

* cited by examiner

Primary Examiner—Richard A. Booth

(57) ABSTRACT

A fully depleted castellated-gate MOSFET device is disclosed along with a method of making the same. The device has robust I/O applications, and includes a semiconductor substrate body having an upper portion with an upper end surface and a lower portion with a lower end surface. A source region, a drain region, and a channel-forming region between the source and drain regions are all formed in the semiconductor substrate body. Trench isolation insulator islands surround the source and drain regions as well as the channel-forming region. The channel-forming region is made up of a plurality of thin, spaced, vertically-orientated conductive channel elements that span longitudinally along the device between the source and drain regions. A gate structure is also provided in the form of a plurality of spaced, castellated gate elements interposed between the channel elements. The gate structure also includes a top gate member which interconnects the gate elements at their upper vertical ends to cover the channel elements. Finally, a dielectric layer is provided to separate the conductive channel elements from the gate structure.

22 Claims, 23 Drawing Sheets

Channel Element Gate-Substrate Capacitance

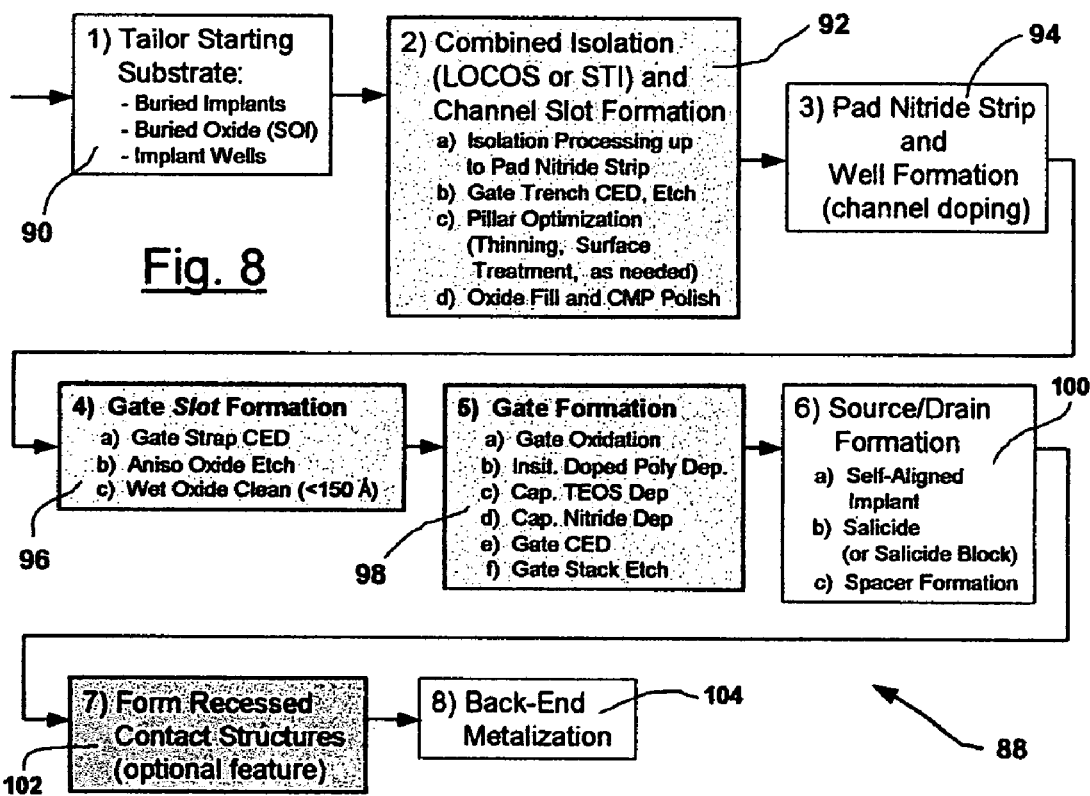
Fig. 8
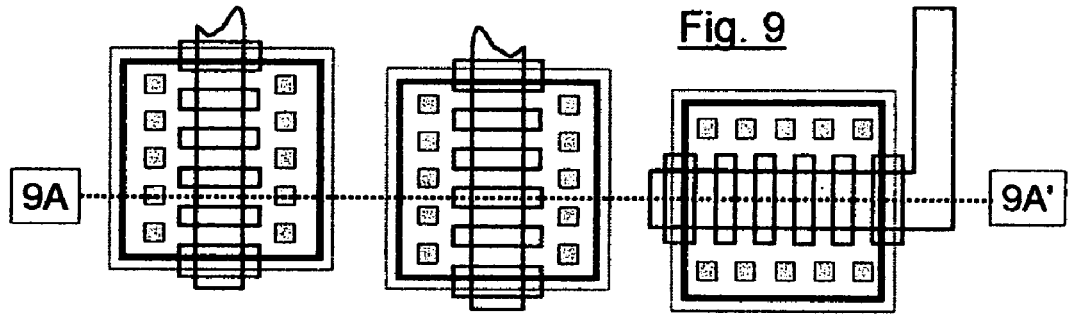
Fig. 9
Fig. 9A

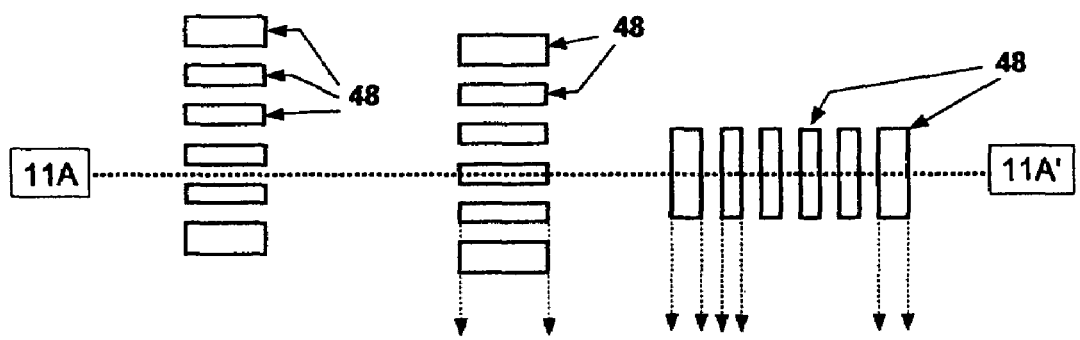
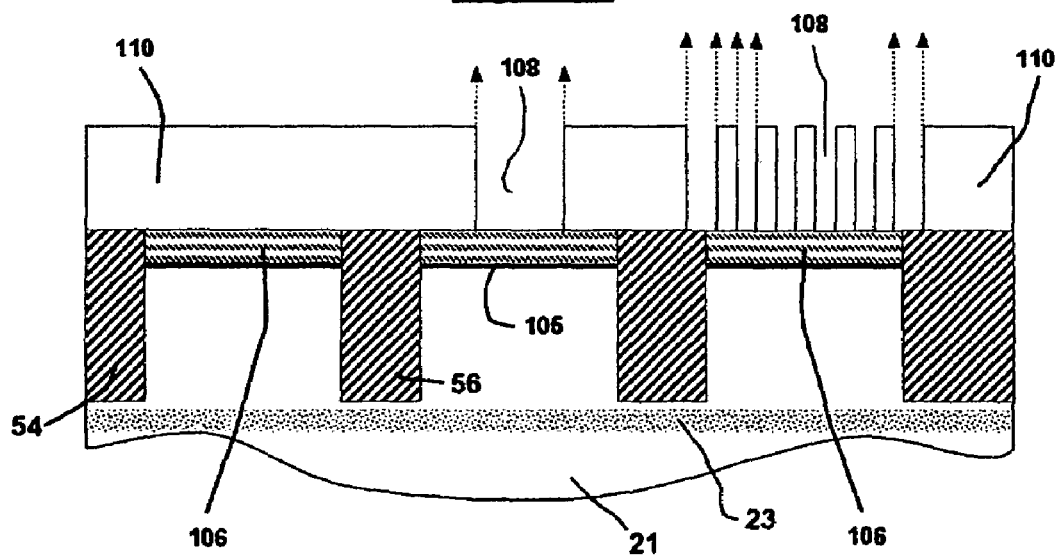

ETCH Silicon

Pillar Thinning and Optimization

Trench Fill and Planarization Fig. 16

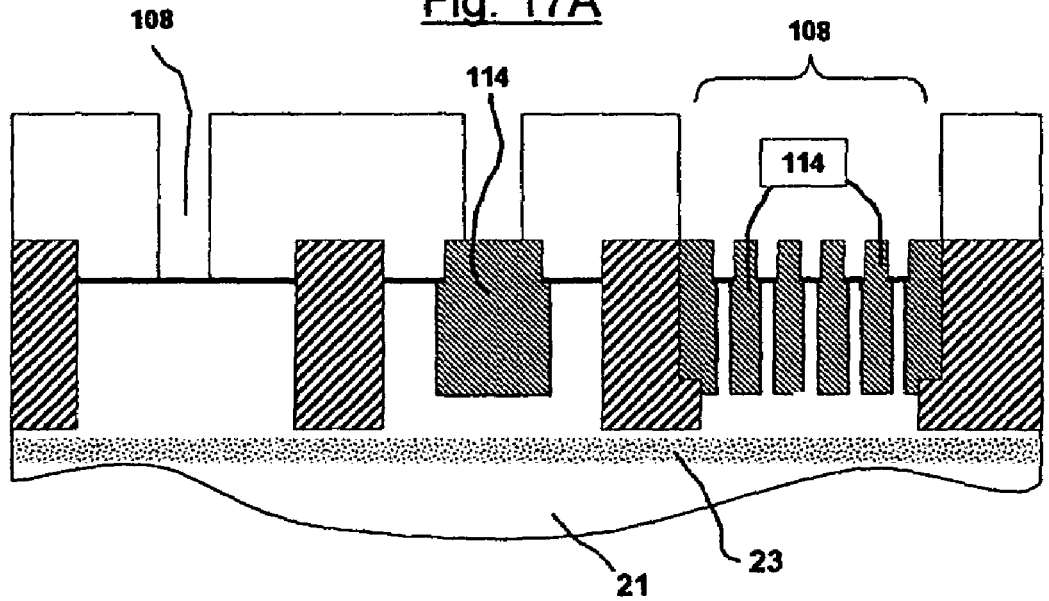
Fig. 17A
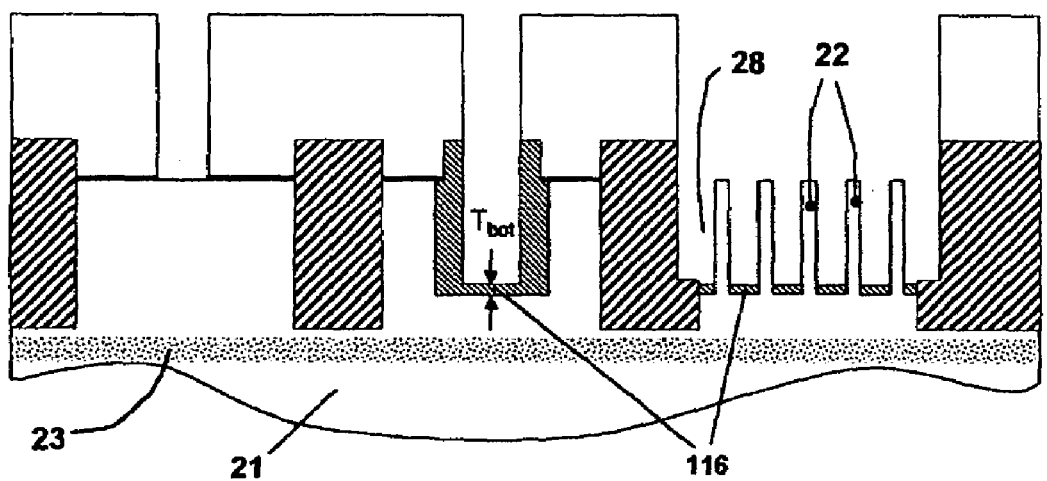
Fig. 18 — Aniso Oxide Etch

Fig. 21A

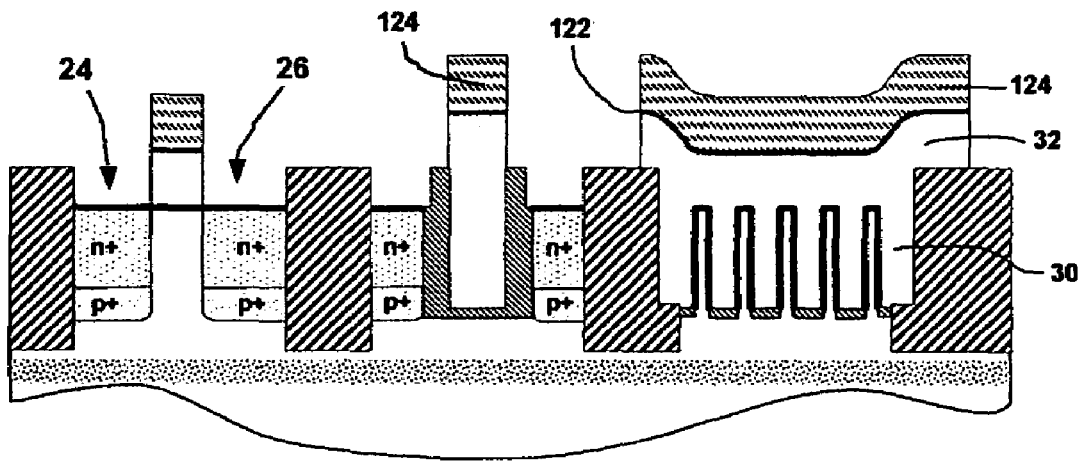

Fig. 22

1) Tailor Starting Substrate:
   - Buried Implants
   - Buried Oxide (SOI)
   - Implant Wells 2) Combined Isolation (LOCOS or STI) and Channel Slot Formation
   a) Isolation Processing up to Pad Nitride Strip
   b) Gate Trench CED, Etch
   c) Pillar Optimization (Thinning, Surface Treatment, as needed)
   d) Oxide Fill and CMP Polish 3) Pad Nitride Strip and Well Formation (channel doping)

4) Dummy Gate Formation
   a) Poly Dep.
   b) Cap. TEOS Dep
   c) Cap. Nitride Dep
   d) Gate CED
   e) Gate Stack Etch 5) Source/Drain Formation
   a) Self-Aligned Implant
   b) Cap Nitride Strip
   c) Furnace S/D Anneal
   d) Optional Spacer Formation 6) ILD Deposition and CMP Polish (gate poly endpoint)

7) Gate Slot Formation
   a) Gate Strap CED
   b) MultiStep Aniso Etch
      - oxide breakthrough
      - polysilicon
   c) Timed aniso oxide etch 8) Gate Formation
   a) Gate Oxidation
   b) Gate Dep (Poly or Metal)
   c) CMP Polish 9) Back-End Metalization

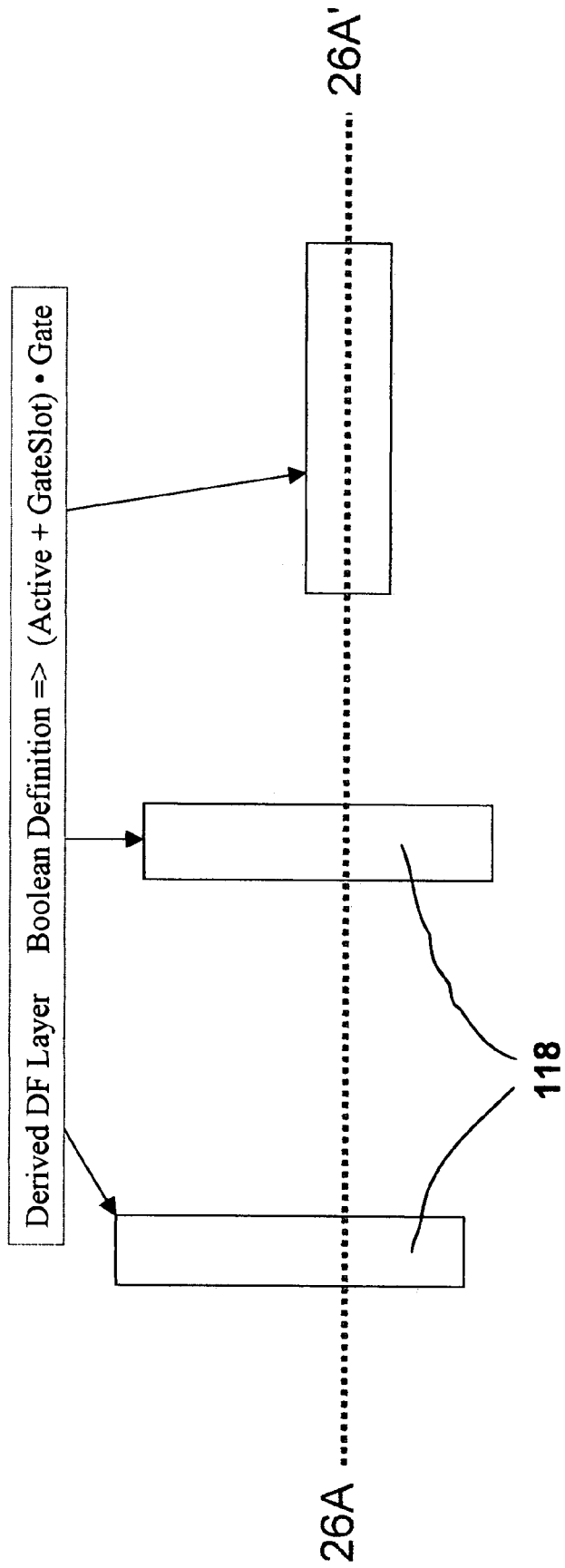

- Pillar Optimization
- Gate Oxidation
- Gate Deposition
- CMP Polish

FULLY-DEPLETED CASTELLATED GATE MOSFET DEVICE AND METHOD OF MANUFACTURE THEREOF

CROSS REFERENCE TO RELATED APPLICATION

This application is a division of U.S. patent application Ser. No. 10/940,093, filed Sep. 13, 2004, now U.S. Pat. No. 7,211,864, to John J. Seliskar entitled, "An Improved Fully-Depleted Castellated Gate MOSFET Device and Method of Manufacture Thereof", the contents of which are hereby expressly incorporated herein by reference.

BACKGROUND OF THE INVENTION

1. Field of the Invention

The present invention relates generally to field effect transistors (FET's) formed as complimentary metal oxide semiconductor (CMOS) structures and, more particularly, to new and improved MOSFET devices having vertically oriented channel structures capable of fully depleted operation at short channel lengths, thereby providing a device for robust I/O applications. Specifically, the present invention relates to an improved MOSFET device and method of fabrication that provides high performance analog and mixed-signal solutions useful in a wide variety of applications.

2. Description of the Prior Art

The progression of CMOS device scaling, that is planer MOSFET, has seen a continuous shrinking of transistor dimensions in both the vertical and the horizontal dimensions resulting in an approximate doubling of the number of transistors per unit area every 18 months or so. From the economics perspective, this scaling progression has resulted in CMOS becoming the preeminent technology for packing system functions on a transistor chip. The desire to shrink gate channel lengths and hence area, as width-to-length ratios remain roughly constant, requires the simultaneous vertical scaling of both the gate oxide and the source/drain junctions. This creates the requirement that the power supply (Vdd) also scale, as indicated above. The power supply voltage must scale so as to maintain gate oxide integrity (breakdown/wearout due to voltage stress), to provide adequate junction breakdown margin, and to minimize device lifetime reduction due to hot carrier injection.

While CMOS scaling has enabled the circuit and system designer to pack a tremendous amount of functionality onto a silicon die, it has simultaneously created a number of significant problems as far as the chip's ability to interface with the outside world. This is particularly true in the area of analog/digital mixed-signal chips, and in particular for communication and power management applications which may be used or exist in a less-controlled signaling environment than found in all-digital systems. Some examples of the efforts to overcome this are illustrated in U.S. Pat. Nos. 4,393,391, 5,675,164, 5,801,417, 5,932,911, 6,111,296, 6,118,161, 6,207,511, 6,396,108 and U.S. Pat. No. 6,413,802.

As a result of the above, the continuing drive to utilize semiconductor chip area while maintaining I/O compatibility has resulted in the evolution of baseline CMOS ASIC/SOC process technologies that now have two gate oxides to account for the need to operate efficiently at two, and sometimes three, power supply levels. Having begun at roughly the 0.25 um node, this is currently the approach taken by certain mainstream ASIC/ASSP semiconductor producers or foundries. These technology offerings generally consist of a baseline process flow that has a fully scaled and optimized thin oxide core device to the extent that the current process manufacturing technology allows, and a thick oxide device which is essentially the core device from the previous technology generation. Unfortunately, in such technology evolution, the thick oxide I/O device has become somewhat of a "forgotten stepchild", as only the thin-oxide core devices can truly take advantage of the shrinking feature sizes that are enabled by state-of-the-art photolithography. More importantly, as the thick oxide device is a "leftover" from the previous technology node, it typically under-performs the thin-oxide core device in terms of speed/bandwidth ($f_t$).

The impact of this trend is particularly acute in the area of all-CMOS analog and mixed analog/digital signal chips. These chips derive their advantage from the ability to integrate complex digital core functions, such as DSP, with analog signal processing functions, such as analog-to-digital or digital-to-analog converters. While this reliability-driven voltage trend results in lower power consumption for digital functions, the effect is not necessarily the same in the analog case. In fact, it has been shown that in an analog-to-digital converter application with a fixed dynamic range requirement, power consumption can actually increase with decreasing power supply.

More problematic from the standpoint of device reliability and survivability is the significantly harsher EMI (electromagnetic induction)/ESD (electrostatic discharge) environment seen by I/O devices used in mixed-signal communications applications. To further illustrate this problem, some typical mixed-signal I/O and communications interfaces include system backplane, chip-to-chip and cell phone (RF). In many such electronic systems, the power supply voltage is specified within a 3-sigma tolerance of ±10%. However, in a data transmission or communication situation, there is the additional problem of signal reflections due to improperly terminated transmission lines.

In the first two mixed-signal examples, that is system backplane and chip-to-chip, a termination problem could chronically arise due to manufacturing tolerances, or as the result of devices connecting and disconnecting from the bus, or perhaps as a "hot swap" situation. Another common example of a harsh ESD/EOS environment is that of the cellular phone. The power amp of the transmitter must be able to tolerate the high VSWR conditions that can occur under large output load mismatch conditions. This can happen if the cell-phone antenna is touched or pulled-off during the transmission of a call.

Another important factor for consideration when discussing I/O robustness in bulk CMOS technologies is that of latch-up, where a low impedance path is created between the power supply rail and the ground rail as a result of the interaction of parasitic p-n-p and n-p-n bipolar transistors. One of the known causes of latch-up is an ESD event that results in the injection of minority carriers from the clamping device in the protection circuit into either the substrate bulk or the well. In a harsh I/O environment, transmission line reflections may also trigger the ESD protect device, thus increasing the probability that a latch-up condition can occur.

At present, BiCMOS (bipolar-CMOS combination) technologies, and particularly SiGe bipolar, offer a solution to some of the problems discussed above. However, a number of difficulties persist including, in particular, power consumption, cost and scalability. Bipolar devices consume significantly more power than CMOS devices, which increases package cost and at some point renders them unsuitable as a system solution, in particular for portable devices. From the standpoint of scaling, bipolar technologies have hit an apparent limit in terms of increasing performance for a given density and power consumption. The integration of CMOS and bipolar devices (BiCMOS) reduces the power consumption problem but leads to a second difficulty, i.e. cost. High performance technologies, such as SiGe BiCMOS cost upwards of 25% or more than CMOS devices at the same feature sizes. Finally, bipolar devices by nature, like the thick oxide CMOS I/O devices discussed earlier, cannot take full advantage of decreasing feature sizes which result from advances in wafer patterning technology (photolithography).

Clearly, the trends and problems discussed above may soon create a situation where it is no longer desirable to integrate a significant amount of analog functionality into a single-chip mixed-signal system solution, thus eliminating one of the traditional paths to reduce cost and power consumption in electronic systems. Accordingly, there is a need for a new type of silicon technology platform that takes advantage of the low power and economic advantages of CMOS in addition to enhancing the I/O function through decreasing feature sizes. There have been numerous attempts to develop such devices which overcome the aforementioned problems. Some specific examples of these efforts are illustrated in U.S. Pat. Nos. 6,111,296, 6,127,702, 6,198,141, 6,355,532 and E.P Patent No. 1,091,413. However, these problems still persist. Therefore, there remains a need in the art for such a device, and the present invention addresses and solves these particular problems in the art.

SUMMARY OF THE INVENTION

Accordingly, it is one object of the present invention to provide an improved, castellated-gate MOSFET device capable of fully depleted operation.

It is another object of the present invention to provide such a device having drive current per unit area increases up to an order-of-magnitude (>10×) or greater than existing VLSI I/O devices.

Yet another object of the present invention is to provide a device with a Unity Gain Frequency three to five times (3×-5×) greater than existing VLSI I/O devices for a given wafer area.

Still another object of the present invention is to provide a high speed I/O device having enhanced ESD/EOS and reliability characteristics relative to existing VLSI I/O devices for a given wafer area.

A further object of the present invention is to provide a high speed I/O device that enables circuitry with improved/reduced latch-up susceptibility on non-SOI wafers.

Yet another object of the present invention is to provide a castellated gate MOSFET device capable of symmetrical operation with respect to the source and drain terminals.

Another object of the present invention is to provide an area-dense VLSI I/O device with improved thermal conduction properties from the silicon active area (heat dissipation).

Still another object of the present invention is to provide a castellated-gate MOSFET device with reduced junction capacitance as compared to its planer counterpart for the same drive current.

A further object of the present invention is to provide a MOSFET I/O device for VLSI applications with reduced equivalent gate resistance as compared to its planer counterpart for the same drive current.

A still further object of the present invention is to provide a MOSFET I/O device for VLSI applications with reduced body effect coefficient, when fabricated on a bulk starting wafer, as compared to its planer counterpart for the same drive current.

To achieve the foregoing and other objects and in accordance with the purposes of the present invention, as embodied and broadly described herein, a castellated-gate MOSFET device capable of fully depleted operation is disclosed along with a method of making the same. The device has robust I/O applications and includes a semiconductor substrate body having an upper portion with a top surface and a lower portion with a bottom surface. A source region, a drain region, and a channel-forming region disposed between the source and drain regions are all formed in the semiconductor substrate body. Trench isolation insulator islands surround the source and drain regions as well as the channel-forming region. The channel-forming region is made up of a plurality of thin, spaced, vertically-orientated conductive channel elements that span longitudinally along the device between the source and drain regions. A gate structure is also provided in the form of a plurality of spaced, castellated gate elements interposed between the channel elements. The gate structure also includes a top gate member which interconnects the gate elements at their upper vertical ends to cover the channel elements. Finally, a dielectric layer is provided to separate the conductive channel elements from the gate structure.

In one modification of the device, the device further includes a buried insulator layer formed in the semiconductor body lower portion beneath the source and drain regions. In one alternative to this modification, the buried insulator layer is spaced below the bottom surface of the trench isolation islands to form a common semiconductor connection in the lower portion of the device. In another alternative, the buried insulator layer abuts the bottom surface of the trench isolation islands and the channel-forming region.

In another modification of the invention, the source and drain regions are each dually doped. More specifically, the upper portion of each of the source and drain regions is doped n-type, in the case of an N-Channel device, while the lower portion of each of the source and drain regions is doped p-type, thereby forming an actual p-n junction in each source and drain region. In an alternative aspect, the dopant of the semiconductor substrate is of a first conductivity type. Moreover, the dopant of each of the upper portions of the source and drain regions is of a second conductivity type while the dopant of each of the lower portions of the source and drain regions is of the first conductivity type but of an order of magnitude greater density than the dopant density of the substrate.

In another modification of the present invention, an improved fully-depleted castellated-gate MOSFET device having robust I/O applications is disclosed. The device includes a silicon semiconductor substrate having an upper portion with a top surface and a lower portion with a bottom surface. A source region, a drain region, and a channel-forming region are formed in the semiconductor substrate body, the channel-forming region being disposed between the source and drain regions. Shallow trench isolation oxide islands are provided having upper and lower surfaces and which surround the source and drain regions and the channel-forming region. The channel-forming region includes a plurality of thin, spaced, vertically-orientated conductive channel elements that span longitudinally along the device between the source and drain regions. A gate structure in the form of a plurality of spaced, castellated conductive gate elements are interposed longitudinally between as well as outside of the channel elements, and a top gate member interconnects the gate elements at their upper vertical ends to cover the channel elements. The gate elements have a depth less than the lower surface of the shallow trench isolation islands. A dielectric layer separates the conductive channel elements from the gate structure. Finally, a buried insulator layer is formed in the semiconductor body lower portion beneath the source and drain regions.

In one modification of the above, the outermost gate elements of the plurality of longitudinally spanning gate elements simultaneously penetrate into both the silicon substrate and the bounding shallow trench isolation oxide islands. In an alternate modification, the device includes contact elements which extend from the source and drain regions to the semiconductor substrate top surface to provide higher series resistance which is beneficial in enhancing ESD characteristics of the device.

In yet another modification of the invention, the source and drain regions of the device are preferably each a composite of n-type and p-type dopant impurities. In one form of this, the device is an NMOS-type device, and the source and drain regions each include an upper portion doped n-type and a lower portion heavily doped p-type to form a p-n junction in the substrate. Additionally, an electrical connection may be provided to the channel elements such that the peak of the doping profile is roughly coincident with the depth of the gate element thereby forming a channel stop. In another form, the silicon substrate is in the form of a silicon-on-insulator substrate, and the channels are of a first conductivity type with the source and drain regions being single-layers of a second conductivity type.

In still another modification of the invention, the dopant of the semiconductor substrate is of a first conductivity type. Additionally, the dopant of the upper portions of the source and drain regions is of a second conductivity type, while the dopant of the lower portions of the source and drain regions is of the first conductivity type but of an order of magnitude greater than the dopant level of the substrate. Moreover, the buried implant layer is also of the first conductivity type and at a substantially higher concentration level than the substrate dopant level.

In a more specific aspect of the invention, the gate element material is selected from the group consisting of polysilicon, tungsten, titanium, tantalum and composites thereof, and the dielectric layer may be selected from the group consisting of silicon dioxide, lanthanum oxide, hafnium oxide, oxynitride (ONO), and silicon nitride.

Alternatively, the conducting gate elements may be made from n-type insitu-doped polysilicon patterned so as to simultaneously connect all formed gate elements with a common conducting strap, while the dielectric layer is composed of silicon dioxide.

In yet another specific modification of the invention, the substrate is selected from the group consisting of bulk, epitaxial, and bonded silicon wafers, preferably with an active layer of 110-crystalline orientation. This group may additionally include engineered substrates containing strained silicon layers and/or silicon-germanium heterostructures and engineered substrates including silicon carbide wafers with or without deposited active layers.

In still another specific aspect of the invention, the dielectric material used to fill the gate slots, and later be partially removed, may be selected from a group consisting of silicon dioxide, CVD diamond, oxynitride (ONO), or silicon nitride.

Another modification of the invention includes a method of manufacturing a fully-depleted castellated-gate MOSFET device. The method includes the steps of creating a starting silicon semiconductor substrate, and then applying active layer pad nitride masks to form shallow trench isolation islands in the substrate. A plurality of thin silicon channel elements are formed by etching a plurality of spaced gate slots to a first predetermined depth into the substrate. The slots are then filled with a dielectric material. An area of the dielectric material is then cleared out within the gate slots to form a spacer followed by the deposition of a gate dielectric. The slot regions are filled with a conductive gate material, and they are then connected together at their upper end surfaces with a top gate layer. Finally, a source and a drain region are each implanted at opposite end portions of the spaced, channel elements.

An alternative method of manufacturing a fully-depleted castellated-gate MOSFET device is also disclosed. This method includes the steps of creating a starting silicon semiconductor substrate and then applying active layer pad nitride masks to form shallow trench isolation islands in the substrate. The nitride masks are removed using hot phosphoric acid. A plurality of thin silicon channel elements are then formed by etching a plurality of spaced gate slots to a first predetermined depth into the substrate. The upper surface of the substrate is planarized by utilizing the pad nitride layer as a CMP etch stop. A thin linear dielectric oxide is deposited to fill the patterned gate slots. An electrical connection, or channel stop is formed by implanting an impurity concentration at a depth that is approximately the same as the still-to-be formed vertical gate elements. An area of the dielectric material is cleared out within the gate slots to form a spacer, and a gate dielectric is then deposited. The slot regions are filled with a conductive gate material, and they are then connected together at their upper end surfaces with a top gate layer. A source and a drain region are each implanted in a self-aligned manner at opposite end portions of the spaced, channel pillars.

Yet another alternative method of manufacturing a fully-depleted castellated-gate MOSFET device is disclosed. This method includes the steps of creating a starting silicon semiconductor substrate and then applying active layer pad nitride masks to form shallow trench isolation islands in the substrate. The nitride masks are removed using hot phosphoric acid. A plurality of thin silicon channel elements are then formed by etching a plurality of spaced gate slots to a first predetermined depth into the substrate. The upper surface of the substrate is planarized by utilizing the pad nitride layer as a CMP etch stop. A thin linear dielectric oxide is deposited to fill the patterned gate slots. A dummy gate stack is deposed and patterned to create self-aligned source and drain regions. A thin interlevel dielectric (ILD) layer is deposited and polished back using the dummy gate as a CMP etch stop, or reference. The remaining dummy gate material is removed and the underlying area of the dielectric material is cleared out within the gate slots to form a spacer. A gate dielectric is then deposited. A conductive gate material is deposed on the wafer, filling the slot regions thereby forming vertical gate elements, and consequently connecting them together at their upper end surfaces with a fully-planarized top gate layer as a result of a final CMP etch step.

BRIEF DESCRIPTION OF THE DRAWINGS

The accompanying drawings which are incorporated in and form a part of the specification illustrate preferred embodiments of the present invention and, together with a description, serve to explain the principles of the invention. In the drawings:

FIG. 8 is a generic flow diagram illustrating one basic process of constructing a device in accordance with the present invention;

FIG. 9 is a top view of the photolithography masking elements of a first process step for making one embodiment of the present invention illustrating two similar orientations and one orientation 90° relative to the first two orientations to illustrate the complete structure of this step in making the embodiment;

FIG. 9A is a cross-sectional view taken substantially along line 9A-9A of FIG. 9;

FIG. 11 is a top view of another subsequent process step for using the gate slot mask to form openings in photoresist in the same embodiment of the present invention illustrating two similar orientations and one orientation 90° relative to the first two orientations to illustrate the complete structure of this step in making the embodiment;

FIG. 11A is a cross-sectional view taken substantially along line 11A-11A of FIG. 11;

FIG. 17A is a cross-sectional view taken substantially along line 17A-17A' of FIG. 17;

FIG. 18 is a sectional view of yet another subsequent process step illustrating the forming of the trench bottoms by anisotropic etching in the same embodiment of the present invention;

FIG. 21A is a cross-sectional view taken substantially along line 21A-21A of FIG. 21;

FIG. 22 is a generic flow diagram illustrating a second basic process of constructing a device using a dummy gate to form the embodiment in accordance with the present invention;

FIG. 26 is a top view of yet another subsequent process step illustrating the forming of the trench bottoms by anisotropic etching, and simultaneously forming a segment of the dummy gate material which is disconnected from the final gate conductor, in the second embodiment of the present invention, with two similar orientations and one orientation 90° relative to the first two orientations to illustrate the complete structure of this step in making the embodiment;

DETAILED DESCRIPTION OF THE EXEMPLARY EMBODIMENTS

One attractive approach to the aforementioned problems, and particularly high speed VLSI I/O, is to incorporate fully-depleted castellated-gate MOSFET's as an add-on to standard CMOS core technologies. A fully-depleted castellated-gate MOSFET is essentially a vertical dual-gate, or tri-gate "FinFET" device, with the important distinction that it normally incorporates multiple "fins" to perform its function, unlike the "FinFET" core technology device which must be optimized to perform its function as a single vertical device or "fin". Additionally, the fully-depleted castellated gate MOSFET of the present invention is intended for use as an I/O device, typically with a much thicker gate oxide than the device technology that would make up a digital core, such as a CPU or DSP, as well as with a higher target operating voltage. Finally, a significant proportion of FinFET devices are intended for fabrication on silicon-on-insulator (SOI) starting substrates, while the fully-depleted castellated-gate (FDCG) MOSFET of the present invention is preferably formed on a lower cost bulk silicon substrate as described in greater detail below. This latter feature of the present FDCG MOSFET can offer significant advantages in reducing the susceptibility of the device to known snapback phenomenon of SOI devices, as well as provide a connection of low thermal resistivity between the channel carrying elements and the wafer bulk thereby aiding heat dissipation in the device.

Figure 1:
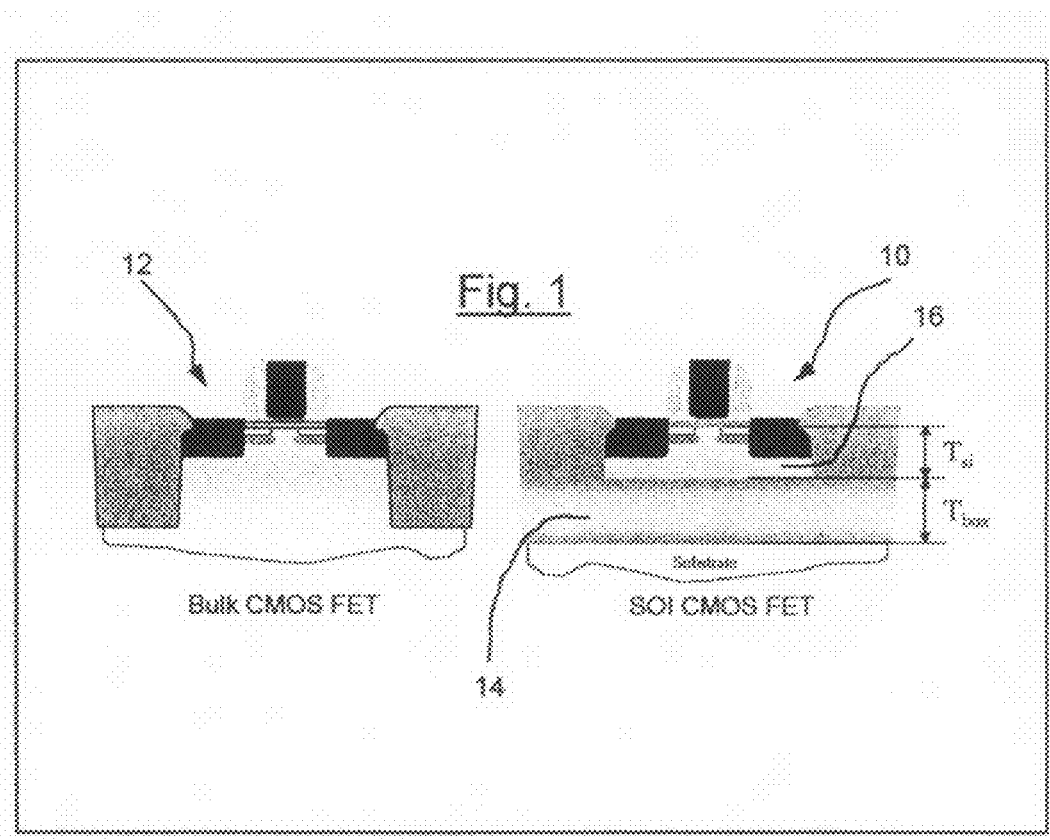
FIG. 1 is a cross-sectional view of prior art structures illustrating a comparison between a silicon-on-insulator MOS device and a similar bulk technology counterpart device.

Generally speaking, the lineage of vertical dual-gate CMOS devices, such as the presently-popular FinFET, can be traced to the development work that has be done in the area of SOI devices, as well as the application of castellated gate structures to improve the performance of GaAs FET devices. Referring now to the comparison illustrated in FIG. 1, SOI MOS devices 10 are quite similar to their bulk technology counterparts 12, but with the addition of an insulating support layer 14 which may be composed of oxide, sapphire, or other appropriate materials. The electrical characteristics of SOI MOS devices 10 are strongly affected by the thickness of the silicon film 16. When the silicon layer 16 is sufficiently thin, the SOI MOS device 10 can operate in a fully-depleted mode.

As the highly desirable electrical characteristics of fully-depleted MOS devices became known, the possibility of having two gates to control the channel region was investigated. In the area of power devices, castellated gate structures have been used to increase the effective width of typically discrete FET devices. While the use of a castellated/periodic gate structure increases the drive current per unit area of these devices, it also proportionally increases their gate capacitance such that no net improvement in Gain Bandwidth Product is produced. Secondly, because the half-periodicity of the gate structure in such devices is greater than the depletion width, no improvement in short channel effects is generally expected. A notable exception to this is the instance where confinement of the depletion region at pinch-off serves to improve the short channel behavior of the device, i.e. a fully depleted structure.

Figure 2:
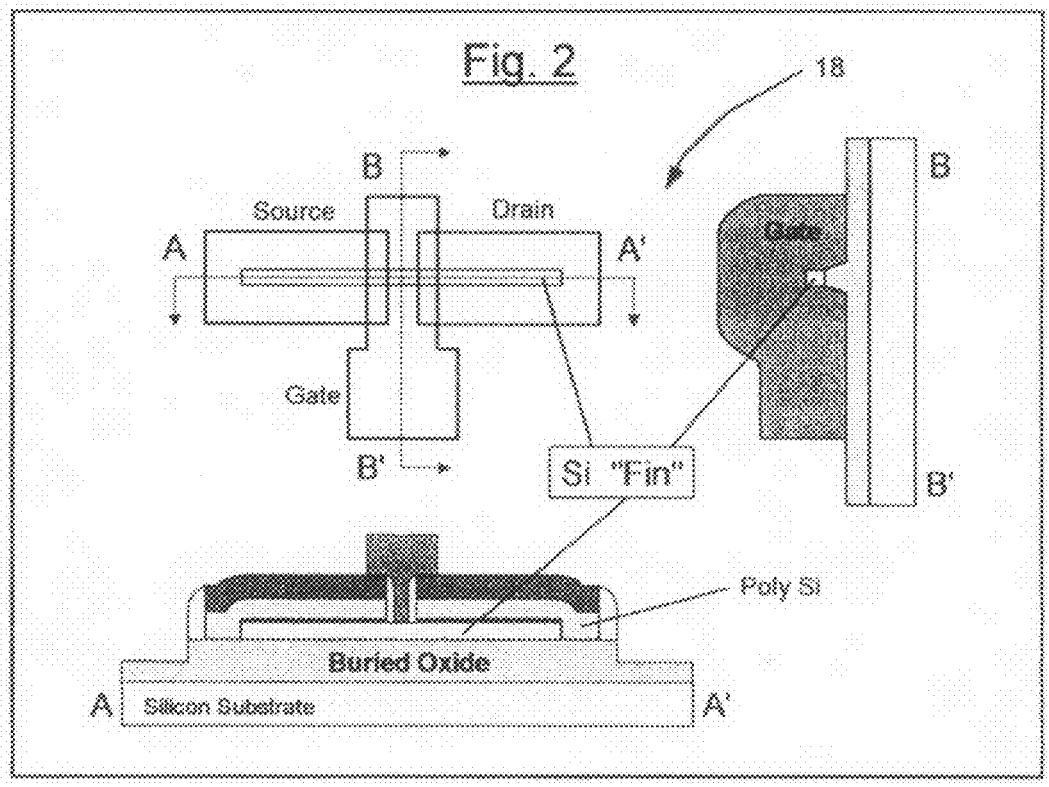
FIG. 2 includes a planar and cross-sectional views of a prior art dual-gate FinFET device on a silicon-on-insulator substrate.

Referring now to FIG. 2, in the area of silicon dual-gate devices, a FinFET device 18 is demonstrated. The FinFET device 18 is a self-aligned quasi-planer SOI device having the advantage that it can be fabricated using existing CMOS manufacturing techniques and mask layout practices. A more flexible fin-type device architecture similar to that of device 18 was also proposed that included the option of using a bulk epitaxial starting substrate. However, this arrangement does not account for the possibility of forming a P-type device on a non-SOI substrate. In spite of the innovations previously described in the area of castellated gate FET's and FinFET silicon devices, the present Fully-Depleted Castellated Gate (FDCG) MOSFET provides an opportunity for a device that can serve as a high performance I/O device add-on in standard foundry-compatible CMOS system-on-a-chip technology. It is within the previously described system-application framework that the device structure and fabrication method of the present invention is disclosed.

Figure 3:
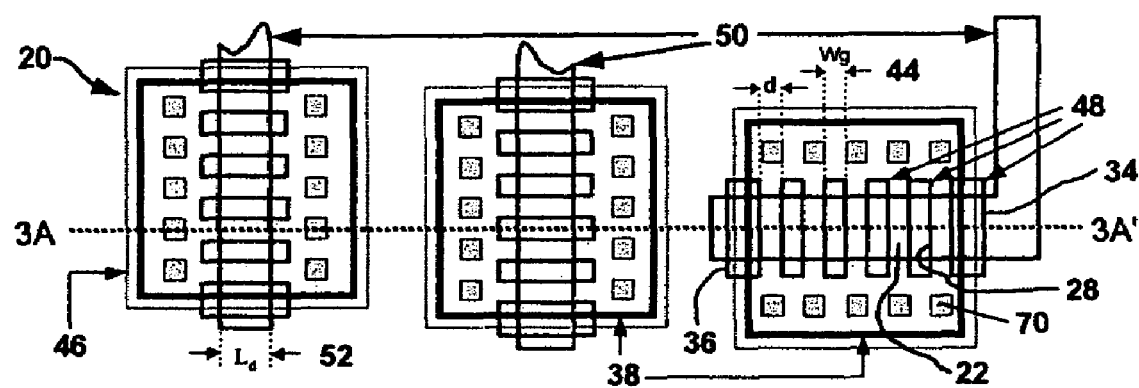
FIG. 3 is a top view of the photolithography masking elements of a first embodiment of the present invention, illustrating two similar orientations and one orientation 90° relative to the first two orientations to illustrate the complete structure of the embodiment.
Figure 3A:
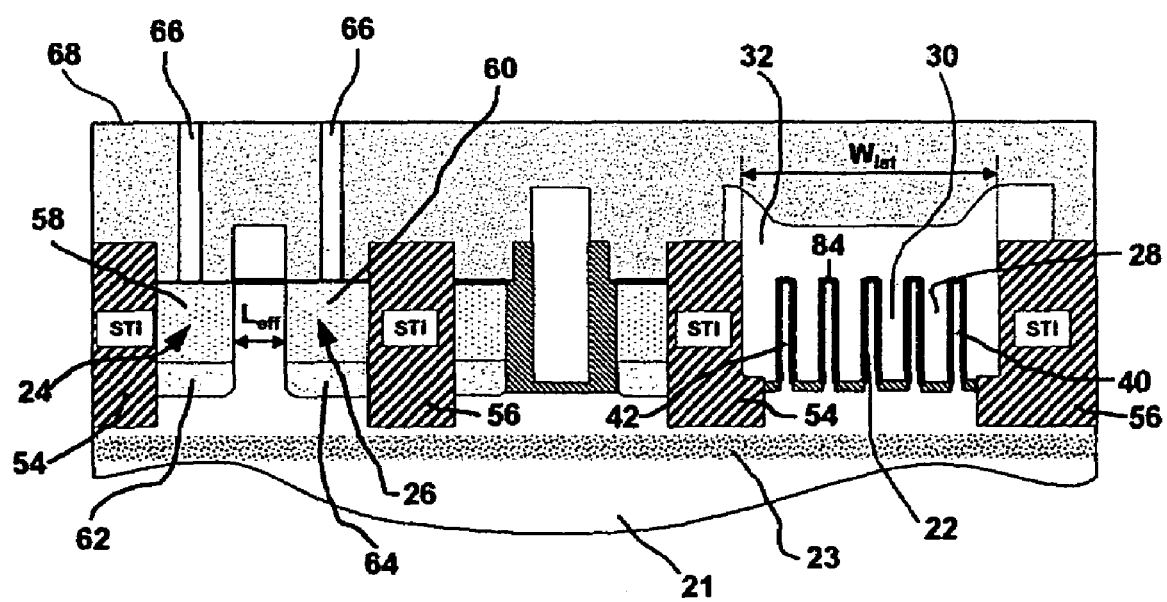
FIG. 3A is a cross-sectional view taken substantially along line 3A-3A of FIG. 3.

Referring now to FIGS. 3 and 3A, a tri-gated NMOS version of the present invention is illustrated with its photo masking layers in one possible embodiment using a low-doped bulk silicon substrate. FIG. 3 illustrates one device in two similar orientations and then in an orientation 90° relative to the first two orientations to illustrate the complete structure from a top view as well as in cross-section as illustrated by FIG. 3A. The device 20 includes a silicon substrate 21 and a plurality of thin silicon channels 22 that span the distance between a source 24 and a drain 26. In summary, these channels 22 are formed by etching gate slots 28 into the active silicon, filling the slots with a dielectric material, preferably oxide, clearing out an area of the dielectric material within the gate slots to thus form a spacer, depositing a gate dielectric, and then filling the slot regions with a conductive gate material to form a plurality of vertical, spaced gate elements 30 which are connected together by a top gate 32. As shown, two outer-most gate-slot mask shapes 34, 36 span both sides of the active region, as defined by the active layer mask 38, in order to eliminate leakage, maintain fully-depleted operation in the two outer-most silicon channels 40, 42, and provide design rule margin in the event of mask misalignment. The outer-most gate-slot masks 34, 36 are shown to be a width greater than the internal array width (Wg) as represented by line 44. It should be noted, however, that the two outer-most silicon channels 40, 42 could also be the same as (Wg), depending on the degree of process control available. Source and drain (S/D) implant masks 46 for the device 20 overlap the active layer mask 38 by a predetermined distance as is a known practice in planer CMOS physical design. The gate-slot masks 48 overlap the gate mask 50 in the direction of channel length (Ld), indicated by line 52, with the amount of the overlap representing the spacer thickness which reduces Cgs. The gate mask 50 overlaps the gate slot mask 48 by a predetermined distance in the direction of the width of the device 20, i.e. orthogonal to the channel length (Ld) 52 for reasons consistent with gate-to-active overlap rules in standard planer CMOS process flows.

FIG. 3A illustrates the cross-section of the device 20 in the two different illustrated orientations. Structurally, the gate slots 28 of the device 20 are etched to a first predetermined depth that is less than the depth of the Shallow Trench Isolation (STI) or LOCOS Field Oxide Islands 54, 56. The gate slot trenches 28 are filled with a dielectric, preferably oxide, planarized, and then re-etched to a second predetermined depth which is less than the first, simultaneously forming a thick bottom gate oxide and spacers between a gate conductor, which will fill the gate slots 28, and the source/drain regions 24, 26. The first and second predetermined depths may both fall within a range of 250 to 1200 nanometers, with the first depth always greater than the second when a bulk wafer is used as the substrate 21.

The outermost gate slot masks 34, 36 result in the formation of outermost gate conductor elements which simultaneously penetrate into both the silicon and bounding Shallow-Trench Isolation (STI) 54, 56 of the device 20. In the case of a dual-gate embodiment of the present invention (see FIGS. 4-4A), a nitride cap 57 may reside on top of the conducting elements 22, thereby shutting off the top gates. The source/drain structure 24, 26 of the device 20 is preferably a composite of both N-Type and P-Type impurities. The depth and thickness of the source and drain implant layers 24, 26 and their relation to the depth of the gate slots 28 are key parameters for the proper operation of the device. In the NMOS example of FIGS. 3 and 3A, the upper portions 58, 60, respectively, of the source and drain regions 24, 26 are degenerately doped n-type. This forms an actual p-n junction to the body of the device 20 and an electrical connection to the channel 22 of the device. The lower portions 62, 64, respectively, of the source and drain regions 24, 26 are heavily doped p-type, such that the peak of the doping profile is roughly coincident with the second predetermined depth to which the gate slots 28 have been etched. This arrangement forms a channel stop by raising the device threshold near the bottom of the gate electrode, and greatly reduces a source of electrons with which to form an inversion layer at the bottom of the gate slot.

Figure 4:
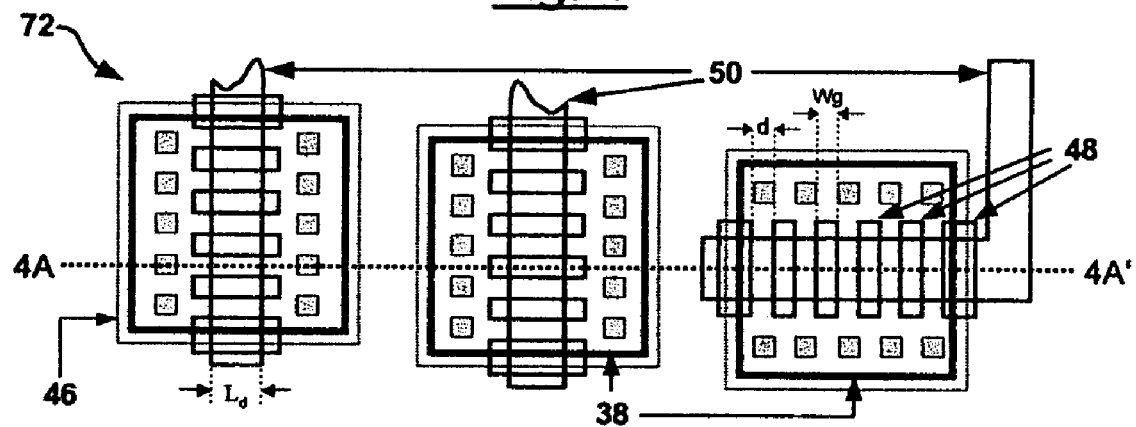
FIG. 4 is a top view including the photolithography masking elements of a second embodiment of the present invention, illustrating two similar orientations and one orientation 90° relative to the first two orientations to illustrate the complete structure of the embodiment.
Figure 4A:
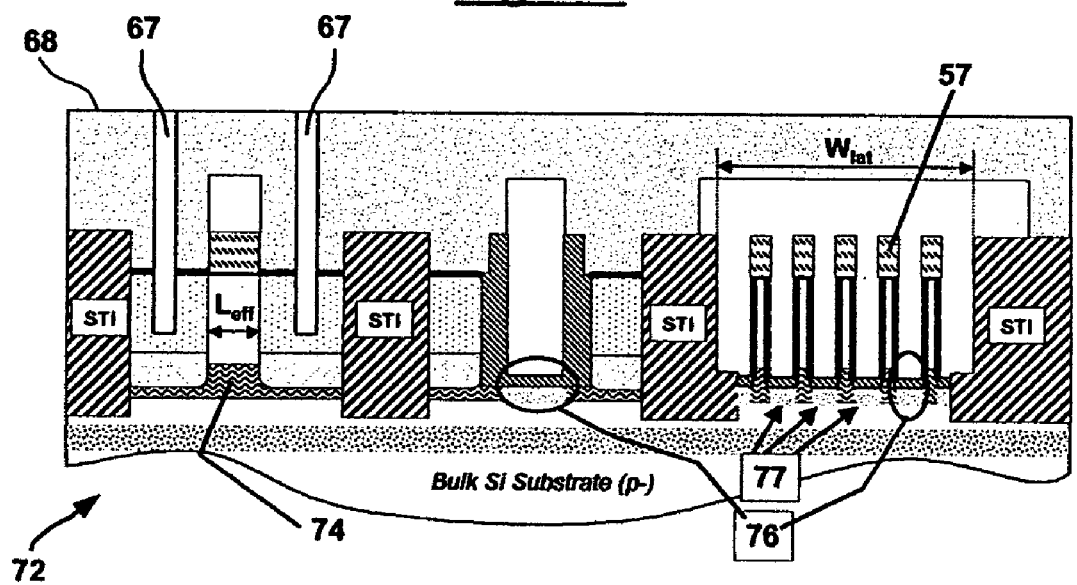
FIG. 4A is a cross-sectional view taken substantially along line 4A-4A of FIG. 4.

The contacts 66 to the source and drain structures 24, 26 may be coincident with the upper silicon surface, or contacts 67 (as shown in FIG. 4A) may penetrate into the uppermost impurity layer depending on the desired device electrical characteristics. For example, surface contacts 66 could result in higher series resistance, which would be beneficial in enhancing ESD characteristics. In the particular example of FIGS. 3 and 3A, the contact masks 70 are laid-out in such a way as to be directly in-line with the conductive channels 22. This approach should provide the least device series resistance, thus improving device performance. Furthermore, it should be understood that additional process steps can be added to the overall fabrication sequence to shut-down the bottom gate. Examples are illustrated in the case of a dual-gate embodiment 72 illustrated in FIGS. 4 and 4A, including the addition of a highly doped "global" buried layer 74, preferably p-type for an NMOS device, and bottom gate implants 77, which raise the threshold voltage of the parasitic bottom gate structure 76 by adding an additional mask layer with associated processing.

Figure 5:
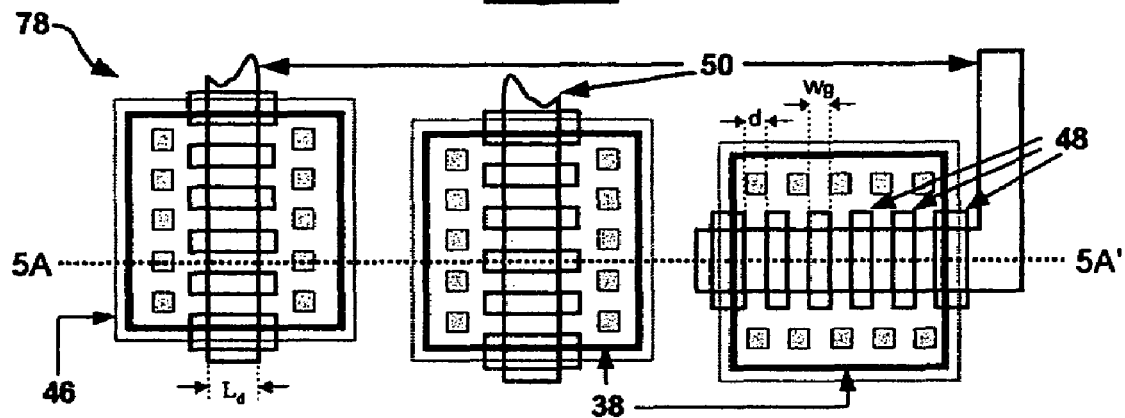
FIG. 5 is a top view including the photolithography masking elements of a third embodiment of the present invention, illustrating two similar orientations and one orientation 90° relative to the first two orientations to illustrate the complete structure of the embodiment.
Figure 5A:
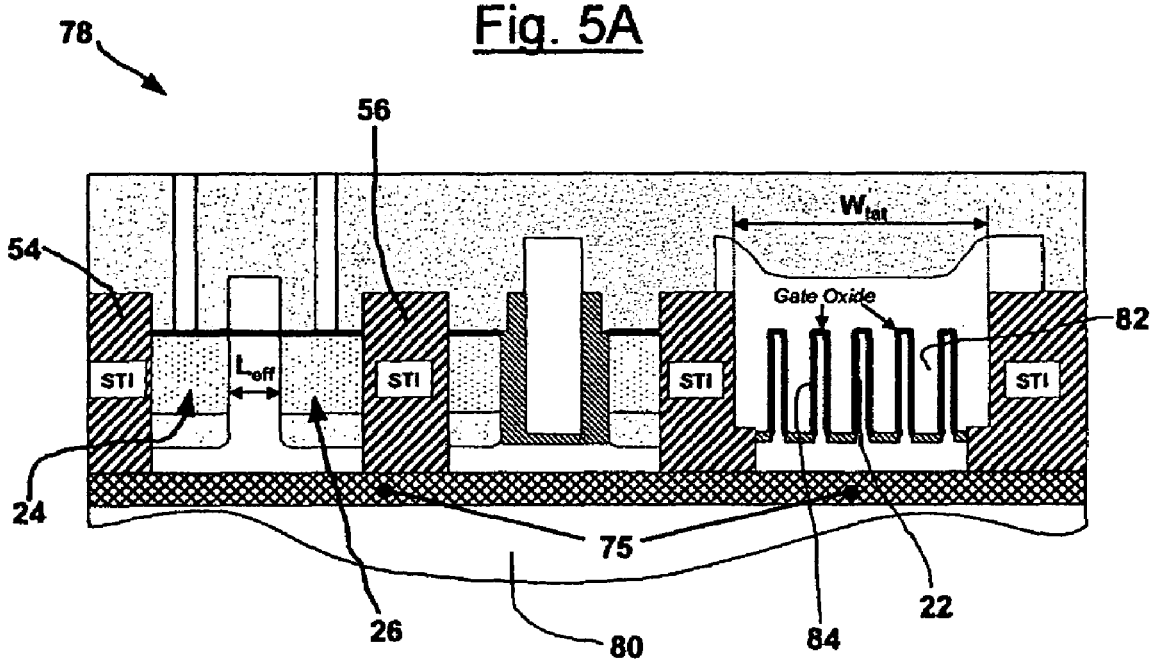
FIG. 5A is a cross-sectional view taken substantially along line 5A-5A of FIG. 5.

FIGS. 5 and 5A illustrate an NMOS device embodiment 78 of the disclosed device invention using a silicon-on-insulator (SOI) starting substrate 80. Note that the device mask layout remains substantially the same as the case of the device 20 with the bulk starting wafer 21 shown in FIGS. 3-3A. Substantially similar to the bulk silicon substrate device 20, the device 78 includes a plurality of thin silicon channel elements 22 that span the distance between a source region 24 and a drain region 26. In the SOI wafer case of the device 78, the device's gate slots 82 can be etched to the same depth as the STI islands 54, 56, that is all the way to the buried oxide 75. However, there are advantages to leaving a common silicon connection in the form of the substrate 21 of FIGS. 3 and 3A at the bottom, thus enabling the use of body contacts which can be employed to eliminate device snapback problems as well as provide a path of higher thermal conductivity with which to dissipate heat.

In the general case of the preferred bulk starting-wafer embodiment of FIGS. 3-3A, fabrication begins with a silicon wafer 21 of a first conductivity type, preferably p-type. The device 20 of this disclosed invention is deposed with the upper portions 58, 60 of the source and drain regions 24, 26 of a second conductivity type, preferably n-type in the case of an NMOS device. The lower portions 62, 64 of the source and drain structures 24,26 shown in FIGS. 3-3A are of the first conductivity type, but at a substantially, i.e. order-of-magnitude, higher concentration level than the concentration of the first conductivity type in the substrate 21.

The optional global buried implant layer 74 shown in FIGS. 4-4A is also preferably of the first conductivity type and also at a substantially higher concentration level than that of the substrate 80. A conducting gate material, preferably n-type insitu-doped polysilicon, is deposed within the gate slots 28 and patterned to simultaneously connect all formed gate elements 30 with a common conducting strap 32. While polysilicon is a preferred gate material, mid-gap metal gates such as tungsten, titanium, tantalum or composites thereof, could also be used with appropriate changes to processing conductions. A dielectric material 84 separates the gate conductor 30, 32 from the conducting silicon channel elements 22. In preferred form, this gate insulator (or separator) 84 is preferably silicon dioxide ($SiO_2$), although other oxides or dielectrics may also be used including lanthanum oxide, hafnium oxide, oxynitride (ONO), or silicon nitride ($Si_3N_4$).

In the case of the SOI starting wafer shown in FIGS. 5-5A, the device 78 may additionally consist only of channel elements 22 of a first conductivity type, and single-layer (i.e., no p-n junction) source and drain structures 24, 26 of a second conductivity type. It should be understood that PMOS devices are formed using the same physical device structure as the above-described NMOS devices, but with the polarities of two conductivity types being reversed. Thus, the device of the disclosed invention prescribes a physical structure that can be used to form NMOS and PMOS devices on the same substrate (CMOS), with the appropriate addition of masking layer(s) to create the corresponding isolating well structures.

The improved DC drive current capability of the device of the present invention can be demonstrated by performing a $1^{st}$-order comparison with a planer MOS device of similar physical area for a given voltage supply level (Vdd). The composite DC electrical behavior of the device constructed in accordance with the present invention can be described using the basic structural representation shown in FIG. 6. As shown in the preferred case, a fully-depleted conducting pillar is formed of width (d), which is the separation of the gate-slot masks 48 of FIG. 3. The resulting element 22 in the preferred embodiment is essentially a single tri-gated FinFET. The gate-slot masks 48 are of width Wg and define gate conductors 30 which extend the previously mentioned second predetermined depth (z) into the silicon wafer 21. The electrical channel length of the resulting conducting element 22 is L. The resulting effective electrical "width" of a single element is $W_{pillar}=2z+d$, so it follows that the electrical width of a device with n elements will be $W_{elec}=n(2z+d)$. It should be noted that the segment defined by Wg does not contribute to conduction. The physical width of the device 20, i.e. the amount of linear wafer dimension, is $W_{lateral}=nd+(n+1)Wg$. As a first order approximation, the DC terminal characteristics of each pillar device will follow the "square-law" characteristic of a standard MOSFET $[Ids \cong \beta(Vgs-Vt)^2]$.

The first-order "drivability" of a MOS device in saturation can be expressed as illustrated in equation (1) below.

$$\text{Driveability} = \frac{Ids}{W_{lateral}} \cong \frac{1/2\mu_{eff}C_{ox}(W_{elec}/L_{elec})V_{eff}^2}{W_{lateral}} \quad (1)$$

wherein $\mu_{eff}$ is the effective mobility, $W_{elec}$ is the electrical width, $L_{elec}$ is the electrical length, Veff is the overdrive voltage (Veff=Vgs−Vt), and Cox=∈r∈0/tox. In comparing the FDCG MOS device to it's planer counterpart, the DC/low-frequency performance improvement can be defined as the ratio of the respective device "driveabilities" for a given gate oxide thickness (tox), or power supply level (Vdd) as indicated in equation (2) below.

$$P_{drv} = \frac{FDCG \; MOS \; \text{Driveability}}{Planer \; MOS \; \text{Driveability}} \quad (2)$$

Figure 6:
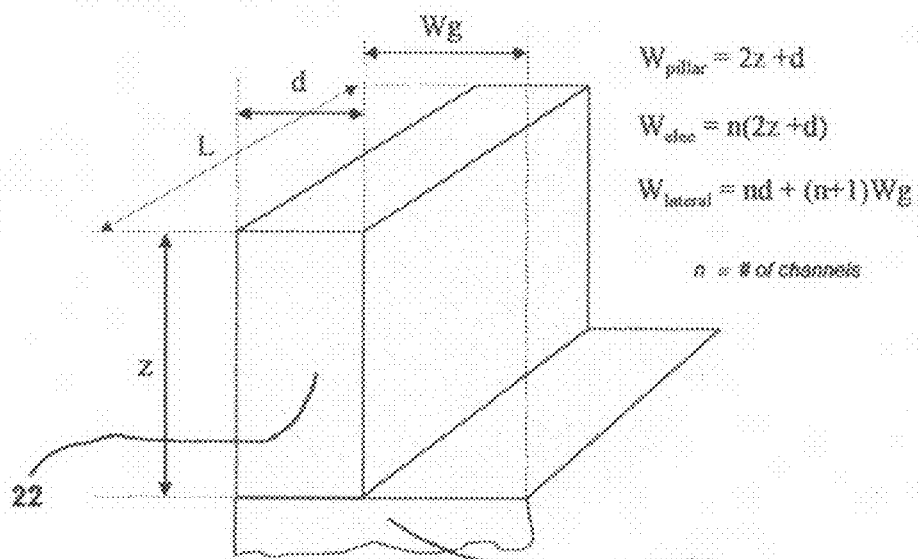
FIG. 6 is a structural representation illustrating the electrical behavior of a device constructed in accordance with the present invention.
Figure 7:
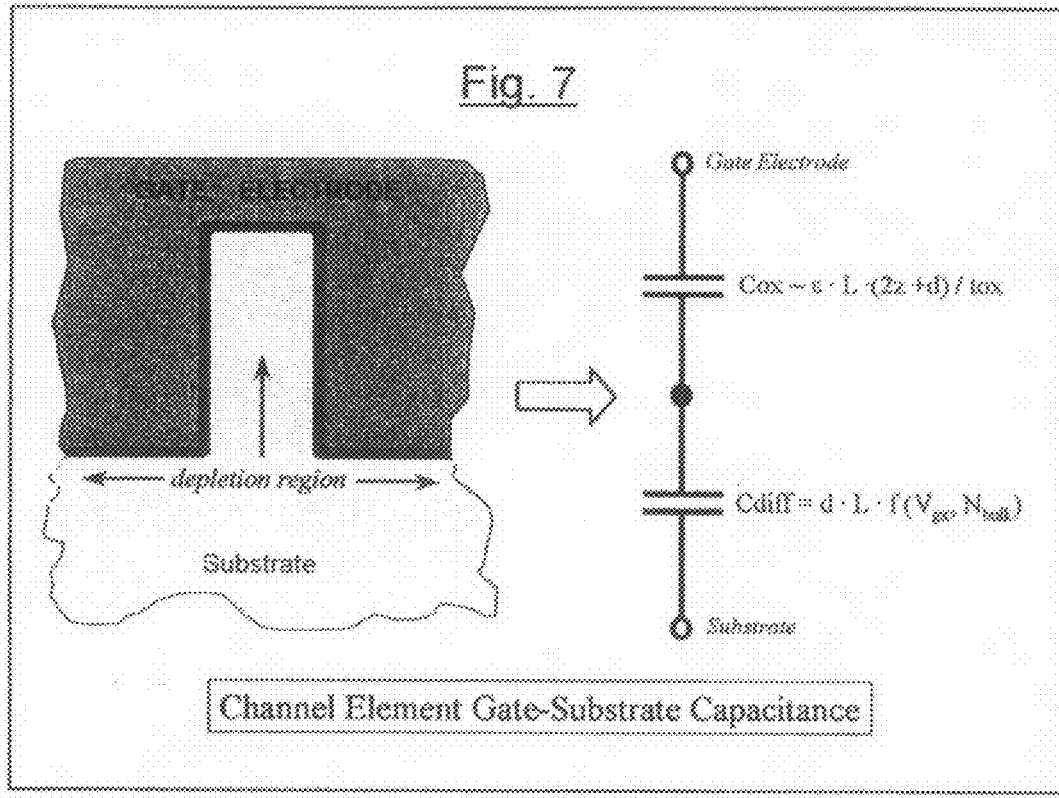
FIG. 7 is a representation illustrating the capacitive characteristics of a device constructed in accordance with the present invention.

From the definitions given with respect to FIG. 6 and the relation defined by Equation 2, the DC FDCG performance improvement for the tri-gated case can be expressed as follows in equation (3):

$$P_{drv|TG} \cong \beta \frac{n(2z+d)}{nd+(n+1)Wg} \left(\frac{L_{eSG}}{L_{eDG}}\right) \quad (3)$$

wherein $L_{eSG}$ and $L_{eDG}$ are the minimum channel lengths of a planer single-gate MOSFET and a vertical double-gated or tri-gated MOSFET, respectively. β represents the ratio of the double-gated and single-gated effective mobilities for a given threshold voltage, where 0.75<β<1.00. In the case where the gate slot separation (d) is increased to the point where fully-depleted device operation no long occurs, the $(L_{eSG}/L_{eDG})$ term in Equation 3 approaches unity.

From Equation 3, one can project a DC performance improvement in the range of $6.3\times<P_{drv|TG}<8.5\times$ between the tri-gate FDCG device and its planar counterpart for a power supply level of 5-volts (tox=120 A). This performance improvement increases to greater than 10× when the margin for short-channel effects affecting the device are relaxed to levels consistent with digital signal functions.

In terms of small-signal/AC behavior, the performance improvement of the FDCG MOS device of the present invention can be quantified by its Unity Gain Frequency, $f_T$. In the case of a MOSFET, the Unity Gain Frequency is defined as the frequency at which the small signal current gain of the device drops to unity while the Source and Drain terminals are held at AC ground. For a MOSFET in saturation (single or double gate), the following mathematical relationship of equation (4) applies.

$$f_T = \frac{g_m}{2\pi C_{gs}} \cong \frac{1.5\mu_{eff}V_{eff}}{2\pi L^2} \quad (4)$$

Equation 4 can be used to define a performance improvement metric, as was done for the dc "driveability" improvement. The resulting expression for AC performance improvement ($P_{ac}$) of a double or tri-gated FDCG device over it's planer counterpart, for a constant power supply (tox), is as follows in equation 5.

$$P_{ac} = \frac{f_{T|DG}}{f_{T|SG}} \cong \beta \left(\frac{L_{eSG}}{L_{eDG}}\right)^2 \quad (5)$$

wherein $L_{eSG}$, $L_{eDG}$, and β are all previously defined. From Equation 5 and available scaling data, the expected AC performance improvement of the FDCG device of the present invention is in the range of 3× to 5× for the power supply levels of interest (2.5<Vdd<5.0).

It should also be noted that as a secondary effect of being able to achieve a target drive current with reduced linear wafer dimension ($W_{lat}$), the device of the present invention will have reduced junction capacitance for the same drive current as compared to its planer counterpart. In addition, since deep source/drain junctions are required for the operation of the disclosed device, it will also have higher junction breakdown voltages as compared to a planer counterpart designed to operate at the same power supply voltage (Vdd).

As mentioned earlier, because the disclosed device is intended for use with comparably thick gate oxides (Tox>70 Å) and higher power supply voltages (Vdd>2.5 volts), it is also possible to realize good operating characteristics with a device constructed in accordance with the present invention without the use of exotic materials for the gate conductor and gate dielectric, as is common for prior art devices. For example, given a gate oxide thickness of 100 Å (Tox=100 Å) and a silicon pillar thickness of 1000 Å (Tsi=d=1000 Å), one can simultaneously achieve NMOS and PMOS threshold voltages of approximately 0.400V and −0.500V, respectively, for doping levels of roughly $2\times10^{17}$, using insitu-doped polysilicon gates. These manufacturing parameters are well within the constraints of any high volume manufacturing facility.

Method 1

Referring now to FIG. 8, a generic process flow 88 is illustrated for creating a device constructed in accordance with the present invention as either an NMOS or PMOS device, with the core of the process being blocks 92, 96 and 98. Referring to the process 88, a silicon substrate wafer is provided at block 90 which has completed standard foundry-compatible CMOS isolation processing up to the point where pad nitride islands, which define the silicon active regions, are stripped-off, typically using hot phosphoric acid. The disclosed device of the present invention can be deposited onto the wafer 21 and then post-processed though standard "back-end" microelectronic fabrication steps that provide wiring and contacts. The starting substrate 21 stated in fabrication block 90 of FIG. 8 may include, but is not limited to, bulk, epitaxial, or bonded silicon wafers, preferably with an active layer of 110-crystalline orientation. Wafers that include Silicon Carbide (SiC) as well as those that incorporate strained silicon layers or Silicon-Germanium heterostructures may also be used. It should also be noted that other active or passive devices can be deposed onto the wafer either before or after the completion of blocks 94-100 in FIG. 8.

At this point, a first possible embodiment of the disclosed device and its fabrication method (Method 1) based on the process 88 is described in detail for the case of an N-type device using a low-resistivity 110-bulk silicon starting wafer. It should be understood, however, that the processing steps disclosed herein are adaptable to any device covered by the claims of the present invention. FIG. 9 illustrates the top-down view of the masking layers (see FIG. 3 for mask definitions) of a bulk starting wafer 21, the cross-sectional view being illustrated in FIG. 9A. A blanket buried p+ layer 23 is preferably implanted as part of the overall impurity well structure, although for defect density reasons this step could be placed in block 94 shown in FIG. 8. This is typically accomplished using a high energy implanter with Boron11 as the implant species.

Figure 10:
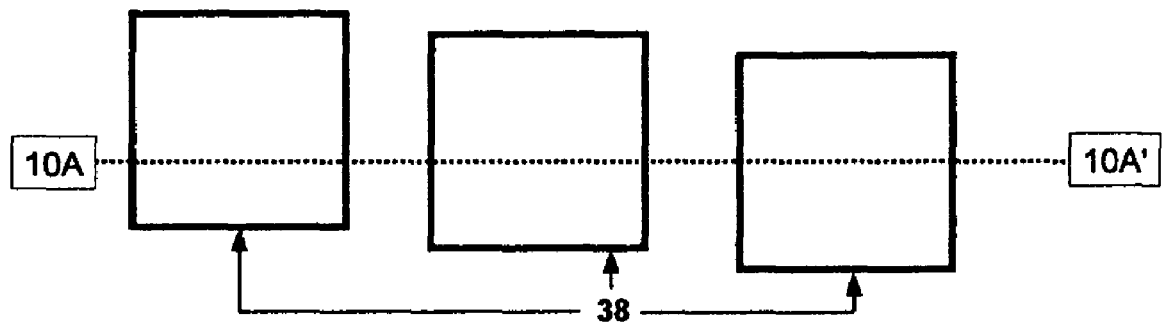
FIG. 10 is a top view of a subsequent process step for applying active layer masks and forming the shallow trench isolation for the same embodiment of FIG. 9 of the present invention illustrating two similar orientations and one orientation 90° relative to the first two orientations to illustrate the complete structure of this step in making the embodiment.
Figure 10A:
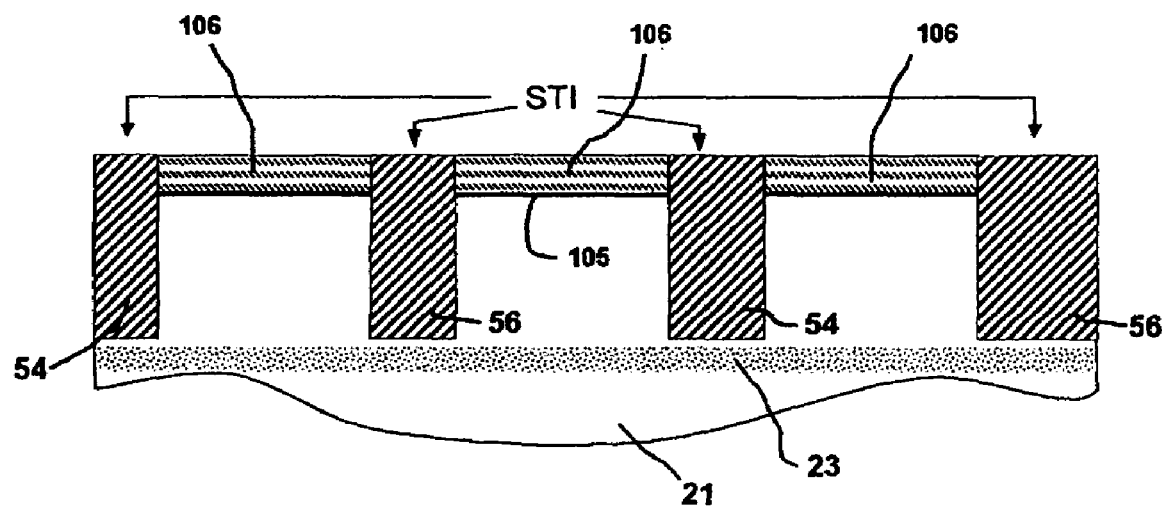
FIG. 10A is a cross-sectional view taken substantially along line 10A-10A of FIG. 10.

Next, as shown in FIGS. 10-10A, the active layer masks 38 are applied, and shallow trench isolation (STI) oxide islands 54, 56 are formed, preferably using well-known reverse-tone active mask techniques in order to allow for more-varied densities and sizes of active silicon oxide islands. FIGS. 10-10A illustrate STI formation just prior to the step where the pad nitride 106 is usually stripped in prior art processes using hot phosphoric acid, thereby completing the fabrication of device isolation. As shown in FIGS. 11-11A, with the pad nitride 106 used to form the active regions still in place, the gate slot mask 48 is used to form openings 108 in a standard photoresist 110 applied to the upper surface of the wafer 21. As commonly practiced in the art when patterning very small features, an anti-reflective coating may also be applied to the wafer 21 in conjunction with the photoresist 110.

At this stage in the process of the present invention, a multi-step etch procedure, which may be completed on a multi-chamber etch platform, is executed to form the trenches or slots 28 for the gate conductor. In the first step illustrated in FIG. 12 of the multi-step etch procedure, the open nitride islands 106 are anisotropically etched where not covered by photoresist 110, stopping on the underlying support oxide layer 105. In the second etch step as seen in FIG. 13, portions of the STI oxide 54, 56 are anisotropically etched in the areas not covered by the photoresist 110 based on a time to depth equal to, or slightly less than, the desired first predetermined depth of the gate slots 28. It is important that the portion of the two outermost gate conductor elements 30 that reside within the bounding oxide isolation not penetrate to a depth greater than the gate slots 28 that reside within the active silicon, or a parasitic leakage path between the source and drain could be formed. In fact, using the masking scheme shown in FIG. 3, the oxide etch could be terminated after penetrating the support oxide underlying the nitride islands 106 as long as the edges of the outermost gate slot masks 48 reside sufficiently within active mask edge 38 in the linear direction of $W_{lat}$, i.e. orthogonal to L. The technique of overlapping the outermost gate slot masks 48 onto the STI islands 54, 56 (or LOCOS region) serves to create an array of oxide islands of uniform topology and material density, i.e. etch rate, which thereby increases the precision of upcoming processing steps. In addition, this overlap approach reduces the adverse effects of gate-slot mask misalignment.

Figure 14:
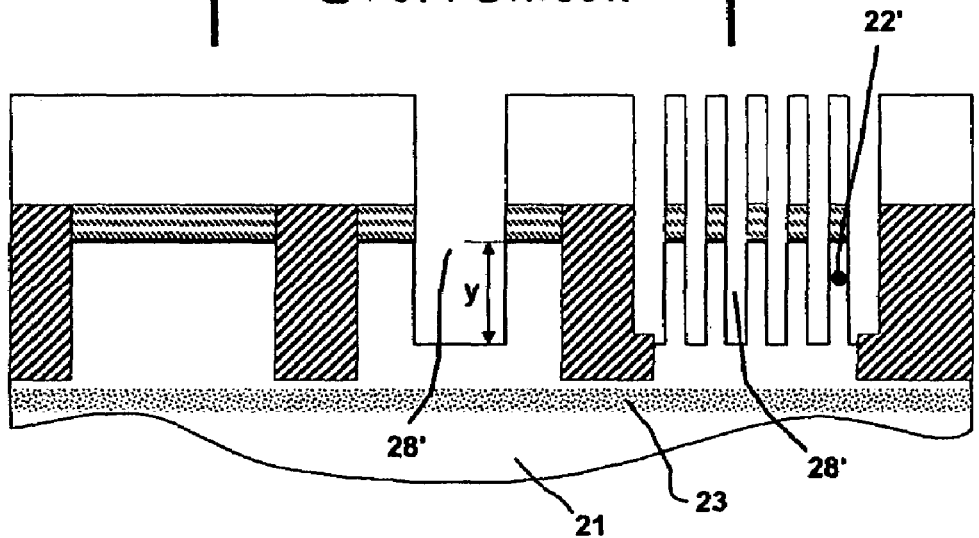
FIG. 14 is a sectional view of another subsequent process step illustrating the last of a multi-step etch procedure to form the trenches for the gate conductor in the same embodiment of the present invention.

Next, as depicted in FIG. 14, the third step of a possible multi-step etch sequence is performed whereby silicon 21 is anisotropically etched to a first predetermined depth (y), as described earlier with respect to FIG. 3. This etch step could be performed using an RIE technique, or wet bath using a dilute heated solution of TMAH (2.38% at 50° C.) in a tool such as the DNS FC-821L. The wet TMAH solution provides the significant advantage that it preferentially etches silicon in the 110-crystalline plane at a significantly higher rate than the 111-crystalline plane, which in this case represents the sidewalls of the conducting elements 22'/slots 28'. The resulting conducting elements 22' have nearly vertical (90°) sidewalls, thus creating conducting fins 22 of uniform thickness and therefore electrical behavior. As an alternative to TMAH, a wet bath of KOH could be used with similar effect.

Figure 15:
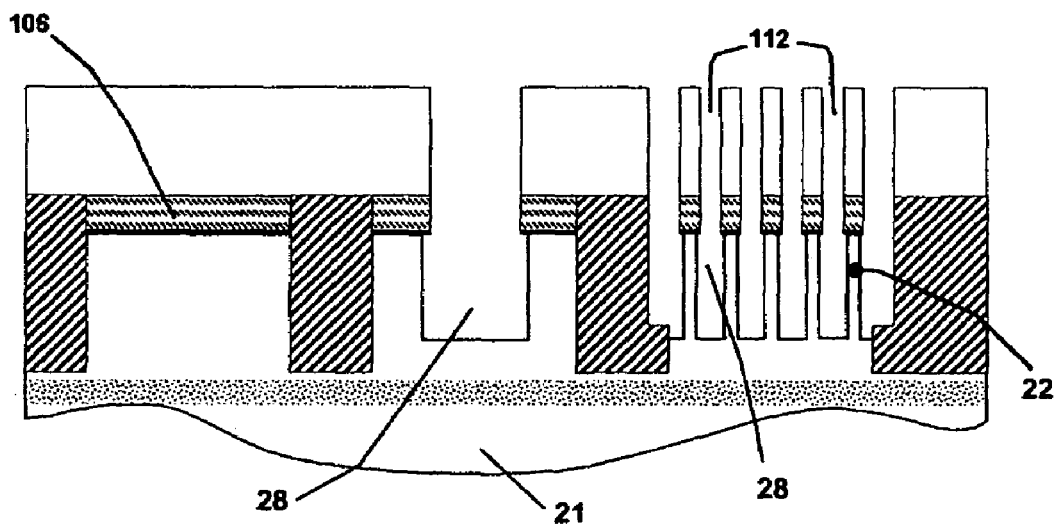
FIG. 15 is a sectional view of another subsequent process step illustrating the isotropic etching of the silicon elements directly after performing the anisotropic silicon trench etch of FIGS. 13-15 in the same embodiment of the present invention.

Ideally, it would be possible to pattern the silicon fins or elements 22 to the desired thickness directly during the lithography step. However, at the present time the ultra-thin features required in the device 20 of the present invention, as discussed earlier, are only directly manufacturable using low-throughput electron beam techniques. Consequently, to achieve the desired fin thickness in a manufacturing environment, isotropic etch techniques are preferably employed to thin the pillar structures 22' to their final target dimension. In one approach, the final dimensions can be realized by isotropically etching the silicon pillars 22' directly, that is widening the slots 112, after performing the anisotropic silicon trench etch as illustrated in FIG. 15. Isotropic silicon etch can be performed in a wet bench using a solution of nitric acid and HF. Alternatively, a dry technique may be used by employing a plasma-assisted downstream isotropic etch technique in a tool such as the Applied Materials DPS-Centura Etch Chamber.

A second approach would be to use the nitride islands 106 as a hard mask and employ isotropic techniques to thin them to the final target pillar thickness prior to the silicon trench etch. This can be done either during or after the step shown in FIG. 12. This is preferably accomplished using dry/plasma techniques through a series of ash and nitride etch steps. With the nitride hard mask patterned to the desired target pillar dimension, the oxide etch step shown in FIG. 13 can be performed. The photoresist 110 can be optionally stripped at this point, and a silicon trench/pillar etch can be performed as illustrated in FIG. 14 with the resulting pillars 22' at their final target dimensions.

Figure 16:
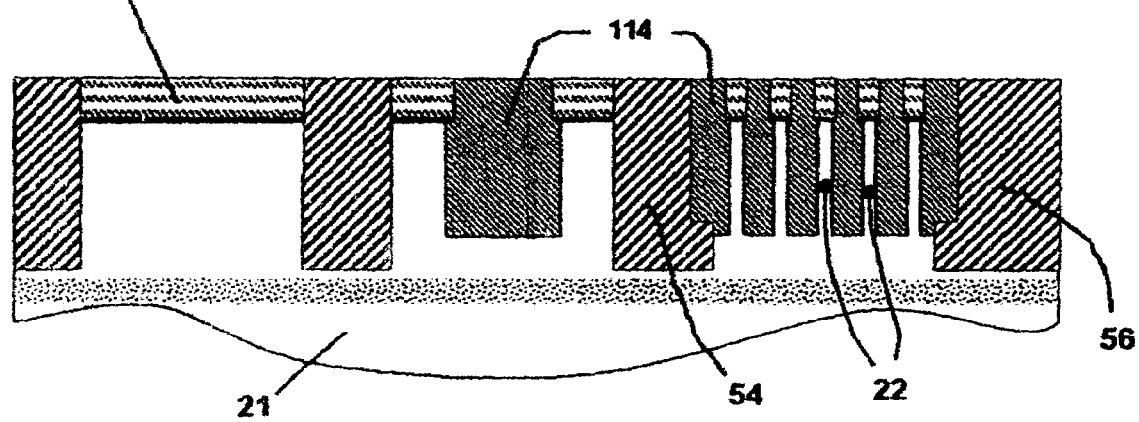
FIG. 16 is a sectional view of another subsequent process step illustrating the deposition of an oxide to fill the patterned gate-slots in the same embodiment of the present invention.

Regardless of which of the above techniques are used to fabricate the silicon elements 22 to their target dimensions, FIG. 16 illustrates the next step of the process to create the device of the present invention. In this step, a thin liner oxide is thermally grown, and a then an oxide or other insulator such as CVD diamond 114 is deposited to fill the patterned gate-slots 28. CMP is used to planarize the wafer using the original active pad nitride layer 106 as a CMP etch stop. It should be noted at this point that because of the ultra-thin target thickness of the silicon elements 22, the thickness of the trench liner oxide must be taken into account during any pillar isotropic processing that occurs before or after the silicon trench etch step shown in FIG. 14.

Figure 17:
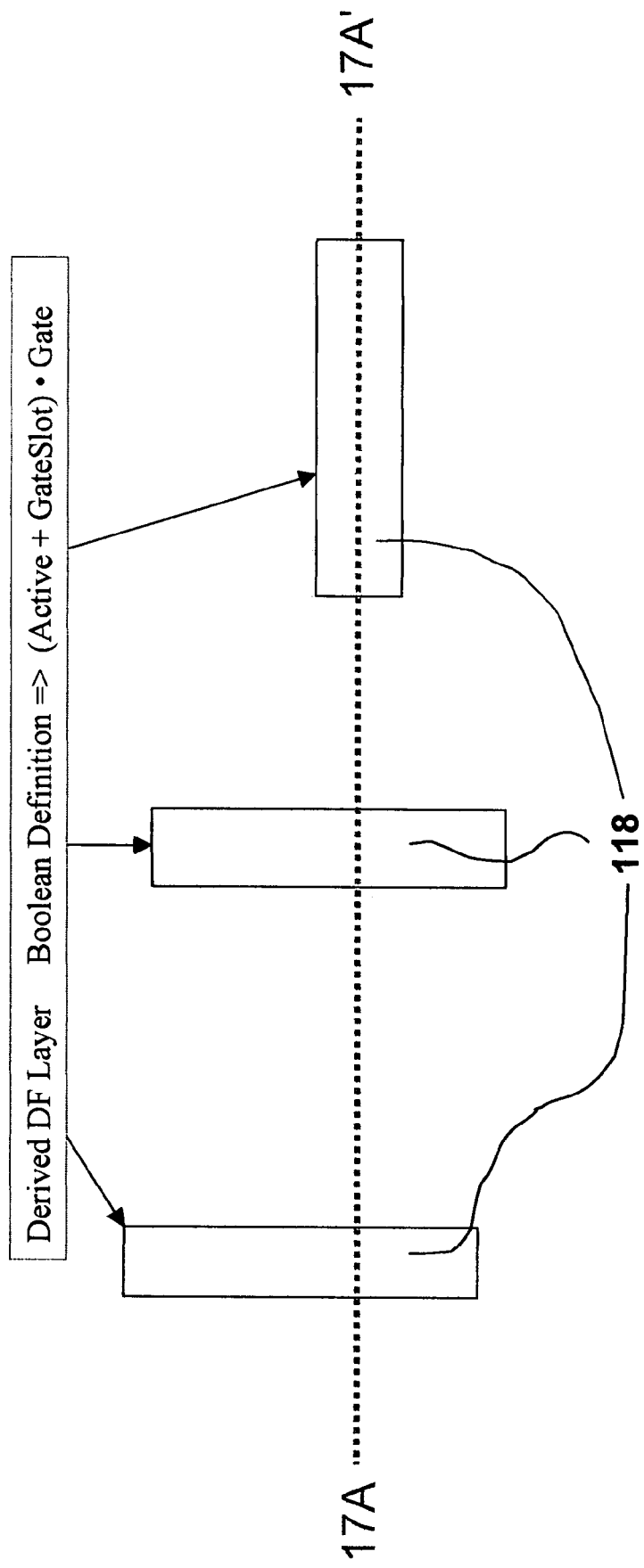
FIG. 17 is a top view of another subsequent process step for using a mask derived from the Active, Gate, and Gate Slot masks to form openings in photoresist in the same embodiment of the present invention illustrating two similar orientations and one orientation 90° relative to the first two orientations to illustrate the complete structure of this step in making the embodiment.

After the completion of the trench fill and planarization steps illustrated in FIG. 16, the pad nitride islands 106 are removed in hot phosphoric acid prior to the step shown in FIGS. 17 and 17A. Next, an optional global buried implant layer 74, as shown in FIG. 4A, may be formed as part of any well implant sequence (see block 94 of FIG. 8) that is used to tailor the doping density of the conducting pillars 22 of the device of the present invention. In the case of an N-Type device, the global buried implant 74 would be of the p+ conductivity type, and is preferably placed at a depth in the range of 0.3 μm to 1.0 μm from the top surface, directly corresponding to the second predetermined depth (z) depicted in FIG. 6. This would increase the threshold voltage of the device at the bottom of the trench, and thereby shut-off any leakage path created by the "parasitic" single-gate device at the bottom of the gate trench.

This arrangement can be accomplished through the use of Boron in the form of B11 or BF2, using implant energies appropriate for their respective atomic weights. Alternately, this buried dopant 74 of p+ conductivity type may be the deeper portion of a "retrograde" doping profile, which is generally known to those skilled in the art. Regardless of the shape of the vertical well profile, the channel fin or pillar structures 22 should preferably have a uniform doping density in the range of $5 \times 10^{15}$ to $6 \times 10^{17}$ per cm$^3$ for channel fin thickness ranging from 700 angstroms to 1200 angstroms, although it should be clear that non-uniform doping densities may optimize or detract from certain performance aspects of the device.

With the channel doping set, the next step of the process sequence, as illustrated in FIGS. 17-18, is to partially remove the insulator 114 in the gate slots 28 which will be filled by the gate conductor, simultaneously forming spacers or elements 22 between the gate conductor and the source/drain regions as well as defining the oxide thickness 116 at the bottom of the gate slot 28 (FIG. 18). This is preferably accomplished by applying a derived dark field mask layer 118 to pattern openings in photoresist 108, defined by the following Boolean expression: (active <or> gate slot) <and> gate, where <and>, <or> are logical Boolean mathematical operations (see FIG. 17), also denoted by + for or, ● or X for and. A carefully timed anisotropic oxide etch is performed at FIG. 18 so that the bottom of the trench 28 that is created lies at the second predetermined depth (z) shown in FIG. 6. The resulting structure is shown in FIG. 18.

Figure 12:
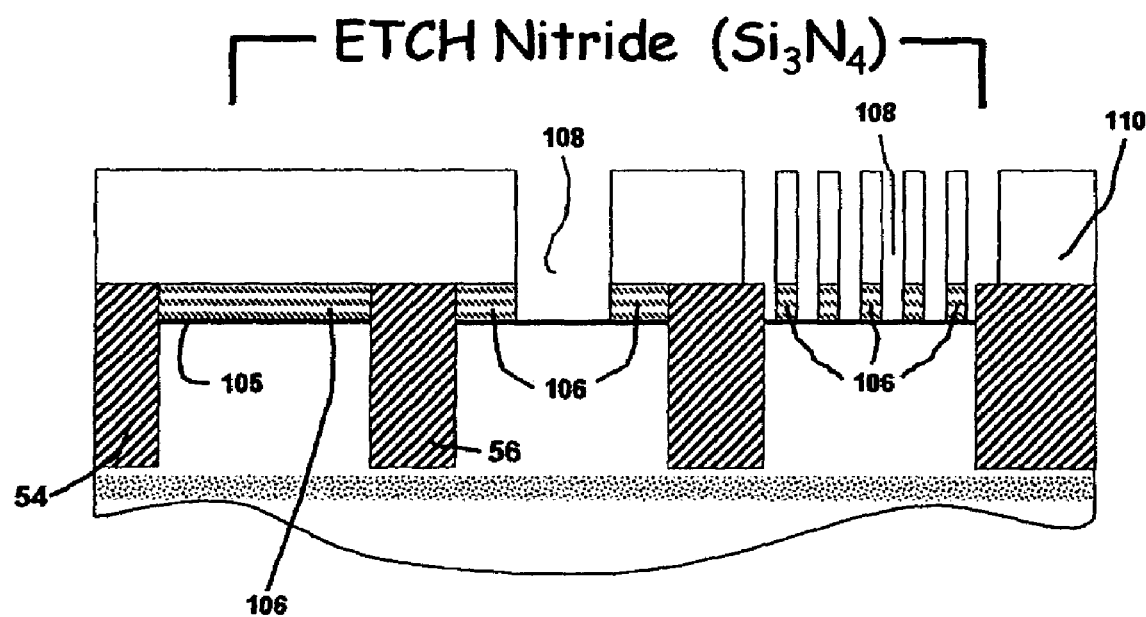
FIG. 12 is a sectional view of another subsequent process step illustrating the first of a multi-step etch procedure to form the trenches for the gate conductor in the same embodiment of the present invention.
Figure 13:
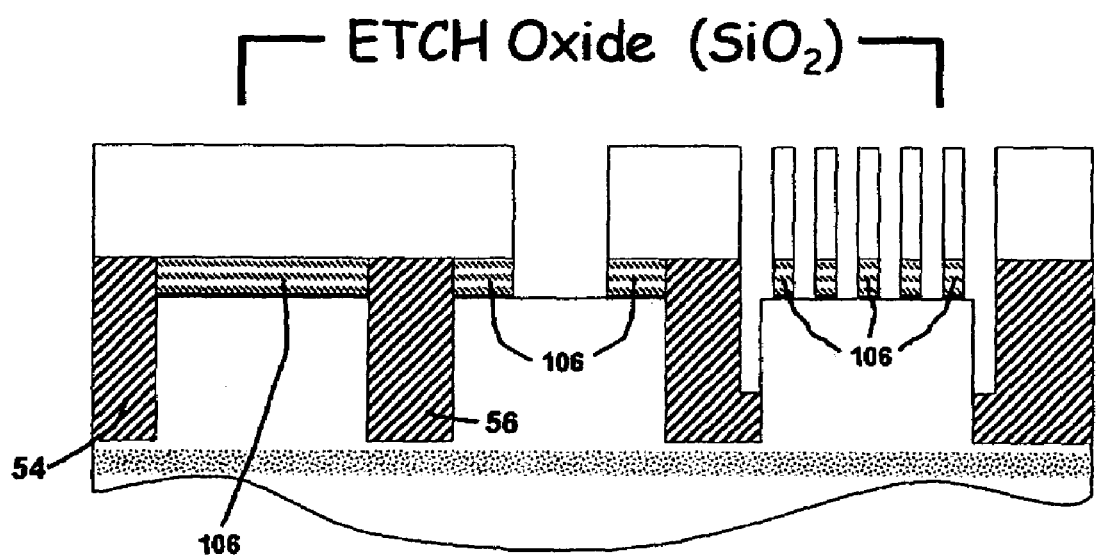
FIG. 13 is a sectional view of another subsequent process step illustrating the second of a multi-step etch procedure to form the trenches for the gate conductor in the same embodiment of the present invention.

The difference between the second predetermined depth (z) and the first predetermined depth (y) that was created during the silicon etch step illustrated in FIG. 12 defines the thickness of a gate oxide 116 at the bottom of the trench ($T_{bot}$), as shown in FIG. 18. While the exact value of $T_{bot}$ is not tightly controlled, since it is defined by two-independent process steps, the important factor is that it be a thickness sufficient to prevent the bottom "parasitic" gate 76 (FIG. 4A) from turning on within the normal operating voltage range of the primary device. In the baseline case of a uniform doping concentration, this means that the bottom gate 76 will have to be thicker than the primary gate oxide ($T_{ox}$) by some constant multiple, for example: $3 < (T_{bot}/T_{ox}) < 8$. Further margin in eliminating this potential leakage path is provided by the composite structure of the source and drain as illustrated in FIG. 3A, as well as the optional global buried layer 74 and bottom gate implants 77 discussed with respect to FIG. 4A.

After completion of the anisotropic silicon etch of FIG. 18, the additional low energy implant 77 discussed with respect to FIG. 4A may be optionally performed to further increase the threshold of the bottom single-gate parasitic MOSFET. In the case of an NMOS device, this implant would preferably be Boron in the form of B11 or BF2 at an energy low enough to place the implant just-underneath the oxide 116 remaining at the bottom of the gate slot trench 28. The execution of such an implant at this stage will have the potentially undesirable secondary effect of increasing the threshold at the top of the channel pillar 22, thus reducing the total available drive current.

Figure 19:
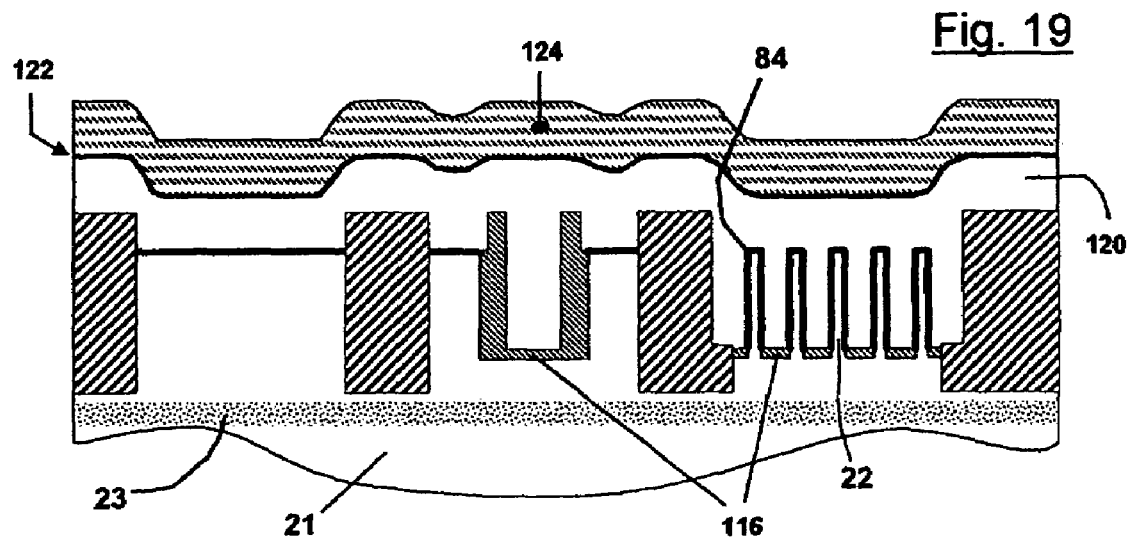
FIG. 19 is a sectional view of another subsequent process step illustrating the formation of a gate stack including a gate conductor, an oxide and a silicon nitride cap in the same embodiment of the present invention.

In the next step of the fabrication sequence and referring to FIG. 19, further optimization of the conducting elements 22 may be performed, including additional narrowing or other treatments to prepare the silicon surface for the formation/deposition of a gate dielectric. A gate dielectric 84 is then formed, preferably of silicon dioxide ($SiO_2$) or oxynitride (ONO), although other dielectrics may also be used. These include but are not limited to hafnium oxide, lanthanum oxide, or silicon nitride ($Si_3N_4$). The deposed gate dielectric layer 84 in the preferred embodiment will have a thickness ($T_{ox}$) in the range of 70 to 150 angstroms in order to support operating voltages (Vdd) in the range of 2.5 to 5.0 volts. After the formation of the gate dielectric, a gate stack is disposed consisting of a gate conductor 120 (preferably n-type insitu-doped polysilicon), an oxide (preferably BPTEOS) 122 which will serve as an etch stop, and a silicon nitride ($Si_3N_4$) cap 124. The silicon nitride film 124 has significant ion-implant stopping power as the result of its higher material density. This feature is required in order to perform the self-aligned source/drain implants without counter-doping non-metal gate materials or the device channel itself. The resulting structural cross-section is depicted in FIG. 19. It should be noted that other gate-stack structures compatible with the preferred embodiment are possible, including the formation of a polycide on a polysilicon gate conductor prior to the application of the nitride cap layer.

Figure 20:
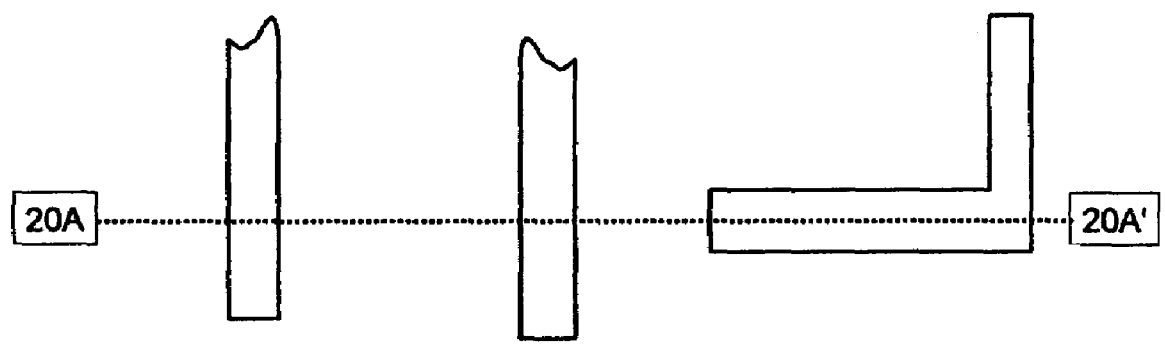
FIG. 20 is a top view of another subsequent process step for patterning and etching the gate stack using a gate mask in the same embodiment of the present invention illustrating two similar orientations and one orientation 90° relative to the first two orientations to illustrate the complete structure of this step in making the embodiment.
Figure 20A:
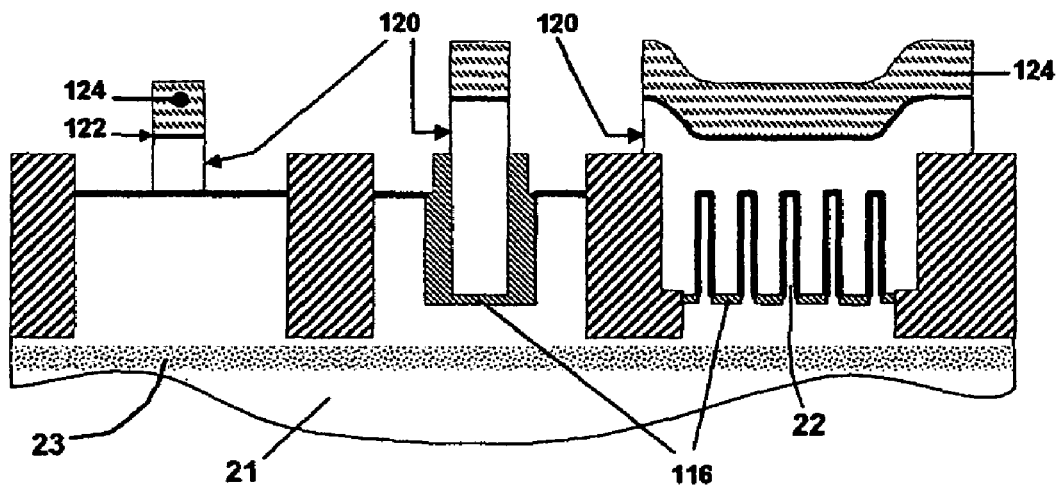
FIG. 20A is a cross-sectional view taken substantially along line 20A-20A of FIG. 20.

With the gate stack in place, the next step in the fabrication sequence for the preferred embodiment is to pattern the photoresist, with the possible inclusion of the previously referenced anti-reflective coating, using the gate mask. A three-step etch sequence is preferably performed beginning with the silicon nitride cap 124, followed by the oxide layer 122, and then finally the gate conductor 120, which is preferably n-type insitu-doped polysilicon. This procedure may be performed on a multi-chamber etch tool such as the Applied Materials Centura etch platform. The resulting structure, minus the photoresist which is well known to the art, is shown in FIG. 20A. Because of overlay tolerances, it should be noted that the actual mask used for the steps depicted in FIG. 20 or FIG. 17 may have to be slightly upsized or downsized, respectively, in order to provide a minimal amount of overlap in the final device structure.

Figure 21:
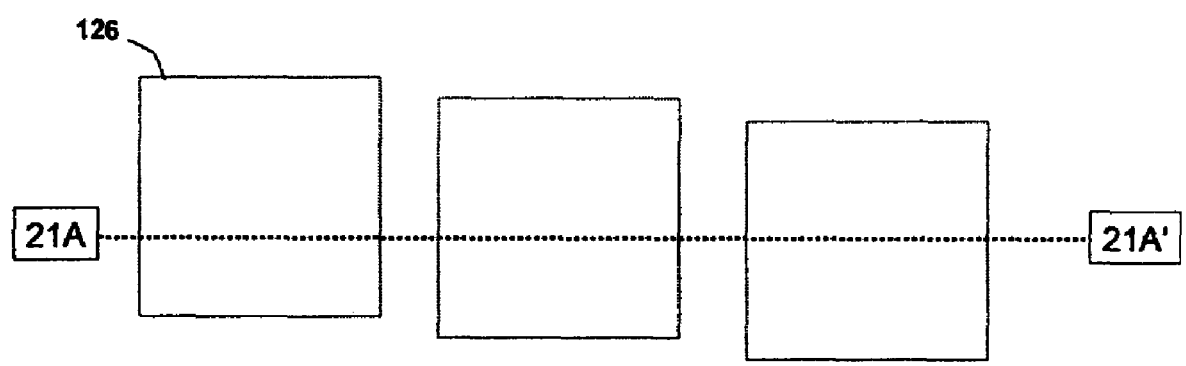
FIG. 21 is a top view of yet another subsequent process step for forming source and drain regions through the application of source and drain masks in the same embodiment of the present invention illustrating two similar orientations and one orientation 90° relative to the first two orientations to illustrate the complete structure of this step in making the embodiment.

After the completion of the gate patterning steps discussed above, a light oxidizing anneal may be performed in the case of a non-metal gate conductor to passivate exposed silicon areas with a thin oxide, as well as to consume any "stringers" that may result from a poly etch process. With the cap nitride layer 124 still in place, self-aligned source and drain junctions 24, 26 are formed through the application of the source and drain masks 126, as depicted in FIGS. 21-21A. As discussed previously, the source and drain structures 24, 26 of the device of the present invention preferably include, respectively, upper portions 58, 60 and lower portions 62, 64. In the case of an N-type device 20, the dopant-peak of the lower portions 62, 64 would be at a depth between the first (y) and second (z) predetermined depths discussed previously with respect to the trench formation process steps. The lower portions 62, 64 of the source and drain implants 24, 26 are preferably of the p+ conductivity type and can be formed using boron in the form of B11 or B12. Because of the higher diffusivity of the boron species, it may be desirable to pre-amorphize the region, where the p-type lower portions 62, 64 reside, with a neutral impurity such as Germanium (Ge) which is known to tie-up the boron during subsequent anneal steps. The upper portions 58, 60 of the source and drain junctions 24, 26 are preferably of an n+ conductivity type for an N-type device, and are preferably formed using phosphorous (P), arsenic (As), or other donor implant species individually or in combination. The required junction depth of the upper source and drain structures 58, 60 would be approximately the same as the second predetermined depth (z), previously depicted in FIG. 6, and may have to be formed using multiple implants in order to result in uniform doping density after annealing.

As was discussed in detail above, the relatively deep source and drain junctions 24, 26 of the preferred device 20 of the invention, as compared to planer devices, necessitates the use of a gate capping layer 124, such as silicon nitride, in order to prevent counter-doping of the top gate conductor in the case of a semiconductor gate, or the device channel region 22 under the gate. Silicon nitride has roughly 50% higher ion implant stopping power than silicon or silicon dioxide. As such, the thickness of the nitride cap 124 deposited during the step depicted in FIG. 19 must be approximately 0.75 times the depth of the lower source and drain structure 62, 64, and this distance is approximately the same as the first predetermined depth (y) discussed in previous steps. By analogy, the use of a substitute material of higher density in place of the silicon nitride would enable the formation of a junction depth the same as the first predetermined depth (y) with a thinner layer of capping material.

After the source and drain processing, the cap material 124 (silicon nitride in this first preferred embodiment) on the gate conductor 32 is removed in a bath of hot phosphoric acid or other appropriate agent. It may be beneficial to perform source and drain anneal steps after removal of the gate capping material 124 in order to passivate exposed silicon surfaces.

Additional steps are now performed to complete the preparation of the device in accordance with the present invention. These steps include the formation of a spacer, salicides and/or salicide blocking. Because of the vertical nature of the channel region of the device 20 of the invention, silicidation of the source and drain 24, 26 may provide no particular benefit and may actually be detrimental by creating high current conditions at the upper corner of the gate strap. Current crowding effects at this corner may be remedied with a carefully designed spacer, or through the application of a salicide block, which is a common practice in most digital CMOS processes. The fabrication sequence of a first possible embodiment of the disclosed device invention, summarized by FIG. 8, is now complete. Contact formation and wiring steps are now performed in the usual manner known to the art to create circuitry, with the resulting final structure illustrated in FIGS. 3 and 3A.

It should be noted at this point that if an SOI wafer is used as a starting substrate, the same process steps summarized in FIG. 8 are used to create the structure illustrated in FIGS. 5 and 5A. In the special case where the gate slot trenches 82 extend all the way to the buried oxide 75, the first (y) and second (z) predetermined depths (see FIG. 6) are the same, and $T_{bot}$ is now the thickness of the buried oxide ($T_{box}$). The source and drain structure 24, 26 is now only of one conductivity type, which is N-Type in the case of an NMOS device.

Method 2

Figure 23:
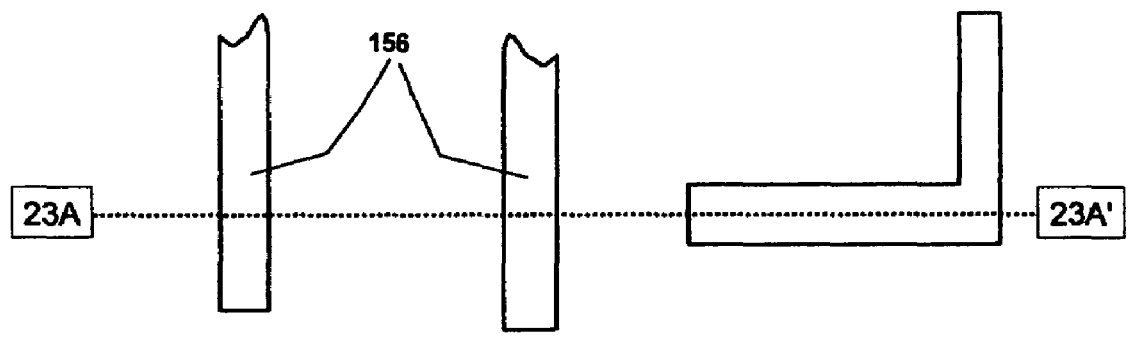
FIG. 23 is a top view of a subsequent process step for applying a gate mask with a dummy gate stack in place followed by a three-step anisotropic etch sequence in the second embodiment of the present invention illustrating two similar orientations and one orientation 90° relative to the first two orientations to illustrate the complete structure of this step in making the embodiment.
Figure 23A:
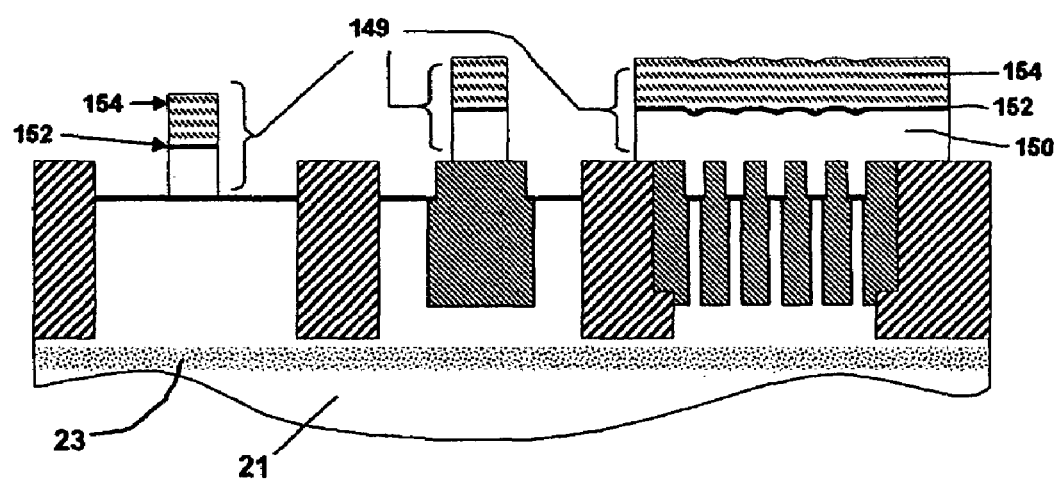
FIG. 23A is a cross-sectional view taken substantially along line 23A-23A of FIG. 23.

A second possible embodiment of the device constructed in accordance with the present invention makes use of a dummy gate to facilitate the formation of a fully planarized gate conductor structure. This approach is particularly useful when a metal, such as tungsten, is used for the gate conductor material. The fabrication process (Method 2) for this second embodiment is summarized in FIG. 22, with the primary structure being formed by steps outlined in blocks 134, 138, 144 and 146. Processing proceeds through the first three steps or blocks in much the same manner as in the first method embodiment (see FIG. 8). After the channel doping has been set, including the addition of an optional global buried implant 74, a gate stack 149 is deposited which may consist of a polysilicon layer 150, an oxide layer 152, and a silicon nitride cap ($Si_3N_4$) 154 as illustrated in FIGS. 23-23A (post-patterning).

In this second method embodiment, penetration of the source and drain implant 24, 26 into the polysilicon 150 is no longer a concern. However, the nitride cap layer 154 provides 50% higher stopping power than polysilicon, thus extending the depth to which the source and drains 24, 26, and therefore the channel slots 22, can be fabricated. The purpose of the polysilicon 150 as the bottom stack layer is so that any spacers or stringers that are formed can be removed utilizing an ashing step. Thus, an advantage of this second embodiment is that the entire dummy gate stack 149 is used to self-align the source and drain implants 24, 26, which provides the opportunity to increase the device drive current with higher aspect ratio gate trenches.

Figure 24:
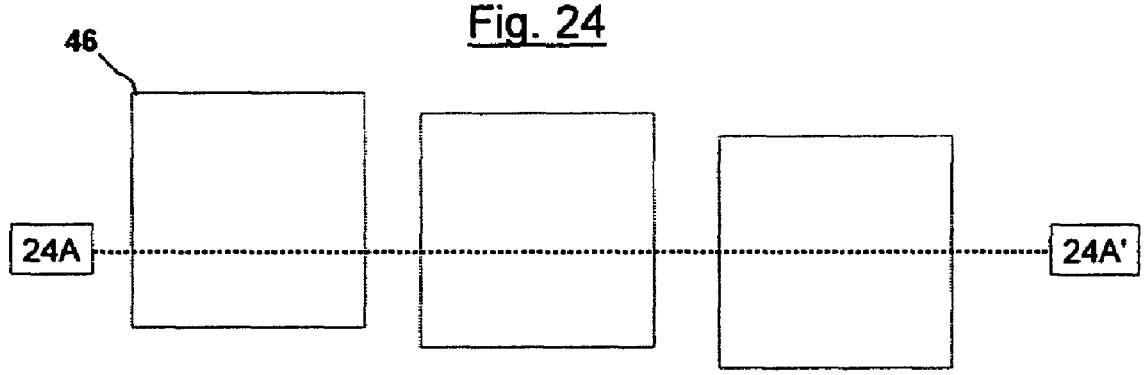
FIG. 24 is a top view of a yet a subsequent process step illustrating the forming of the source and drain ion implantation step using source and drain masks after patterning the dummy stack in the second embodiment of the present invention, with two similar orientations and one orientation 90° relative to the first two orientations to illustrate the complete structure of this step in making the embodiment.
Figure 24A:
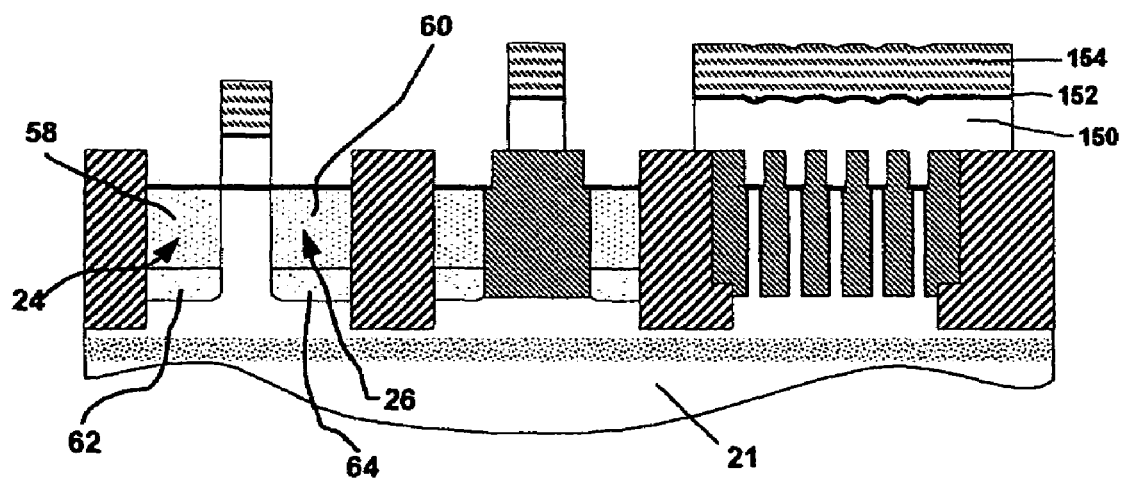
FIG. 24A is a cross-sectional view taken substantially along line 24A-24A of FIG. 24.

The thickness of the total gate stack 149 must provide the net stopping power to block the implant that forms the bottom portions 62, 64 of the lower source and drain structure 24, 26 (p-type in the case of an NMOS device) from penetrating into the device channel (FIG. 24A). This lower source and drain depth 62, 64 is approximately in between the first (y) and second (z) predetermined depths, as discussed with respect to the first embodiment. With the dummy gate stack 149 in place, the gate mask 156 is applied, and a three-step anisotropic etch sequence is preferably performed just as in the case of the first embodiment (see FIG. 23). As in the prior embodiment, a multi-chamber plasma etch tool such as the Applied Materials Centura Platform may be used to perform this fabrication step.

After the dummy gate 149 has been patterned, the source and drain masks 46 are used as shown in FIGS. 24-24A to perform the source and drain ion implantation step. These source and drain structures 24, 26 generally consist of the same upper and lower components or portions 58, 60 and 62, 64, respectively, and are at the same depths as described in the first embodiment of the invention. After source and drain implants have been completed, the cap nitride layer 154 is removed preferably in a bath of hot phosphoric acid, followed by a furnace anneal step. Removal of the cap nitride 154 at this stage is optional, but it is a preferred approach as it simplifies the processing steps that follow.

Figure 25:
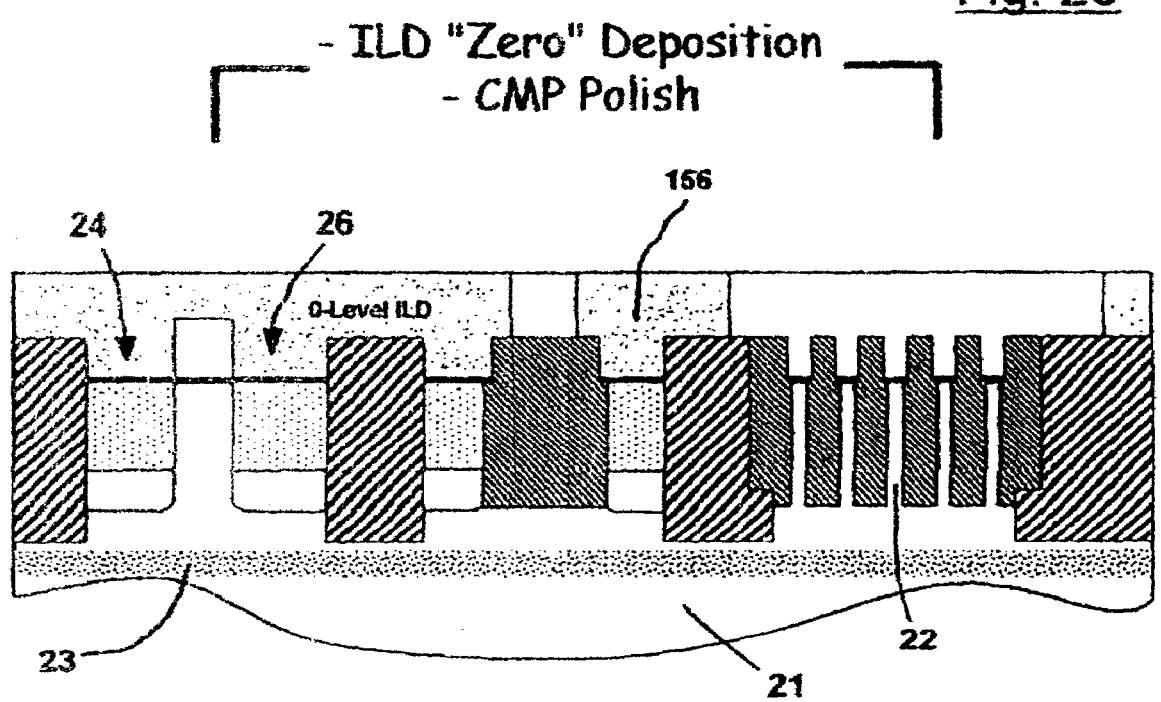
FIG. 25 is a sectional view of another subsequent process step illustrating the deposition of a dielectric oxide to form a zero level insulating layer with subsequent planarization in the second embodiment of the present invention.

In the next step of the fabrication sequence for the second embodiment of the disclosed invention, a dielectric, preferably oxide, layer 156 is deposed forming a zero level insulating layer. Referring to FIG. 25, the wafer is then planarized using CMP which utilizes the previously patterned polysilicon dummy gate as an etch stop or reference. In the next fabrication steps depicted in FIGS. 26-26A, the polysilicon dummy gate 149 is removed, followed by the oxide filling the gate slots 28. This is preferably accomplished by applying the derived dark-field mask 118 discussed previously with respect to the first embodiment (see FIG. 17). Also, as in the first embodiment of the disclosed device, overlay tolerances may require the application of a sizing offset between the gate shapes used in FIGS. 23-23A and 26-26A.

Figure 26A:
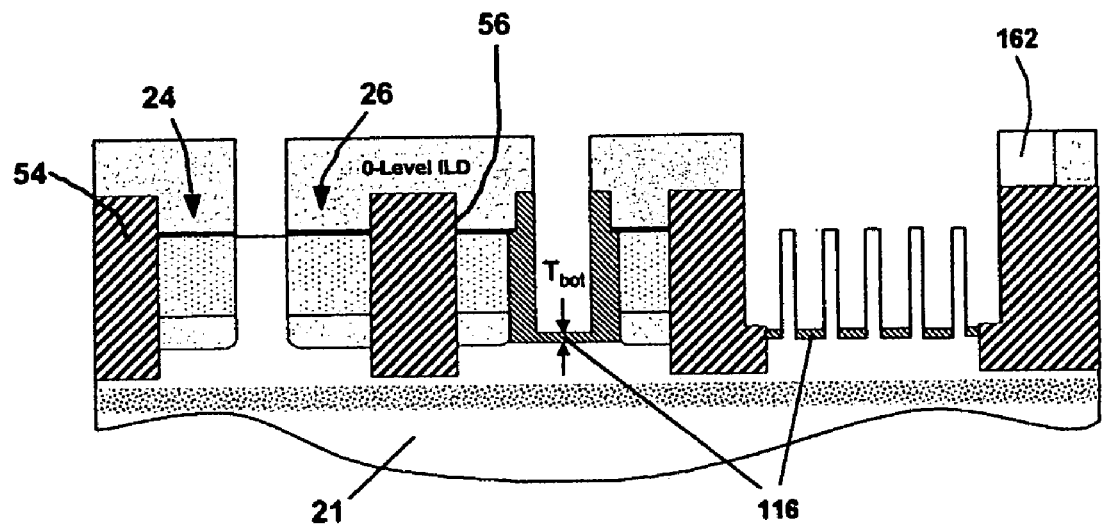
FIG. 26A is a cross-sectional view taken substantially along line 26A-26A of FIG. 26.

The fabrication steps depicted in FIGS. 26-26A are preferably executed in a multi-chamber plasma etch tool. In a three-part sequence as described in FIG. 22, an oxide "breakthrough" etch step (block 144) is performed to remove any oxide that has not been completely cleared by the CMP polish step depicted in FIG. 25. This is followed by an anisotropic polysilicon etch, stopping primarily on support oxide. As can be seen in FIGS. 26-26A, the gate formation method of this second embodiment results in a disconnect between the drawn dummy gate shapes and the final gate conductor. As will be seen in later steps of this method, this resulting disconnect will be the final gate dielectric film with floating segments of polysilicon/dummy gate 162 remaining in place. Consequently, two or more separated gate structures can only be joined by upper level (e.g., Metal1) wiring levels. In the final step of the multi-step etch sequence, a carefully timed anisotropic oxide etch is preferably performed, as in the first embodiment, so that the bottom of the trench that is formed is at the second predetermined depth (z) shown in FIG. 6.

In the next step of the fabrication sequence, specified by block 146 in FIG. 22, further optimization of the conducting pillars may be performed, including additional narrowing or other treatments to prepare the silicon surface for the formation/deposition of a gate dielectric 84. A gate dielectric 84 is then formed (FIG. 27), preferably of silicon dioxide ($SiO_2$) or oxynitride (ONO), although other dielectrics may also be used including but not limited to hafnium oxide, lanthanum oxide, or silicon nitride ($Si_3N_4$). After the gate dielectric 84 is in place, a gate conductor 30, 32 is deposed. The gate may consist of in situ-doped polysilicon, a mid-gap metal including tungsten, tantalum, titanium, or composites thereof. After the gate conductor has been deposed, the wafer is preferably planarized using CMP, resulting in the structure shown in FIG. 27.

Figure 27:
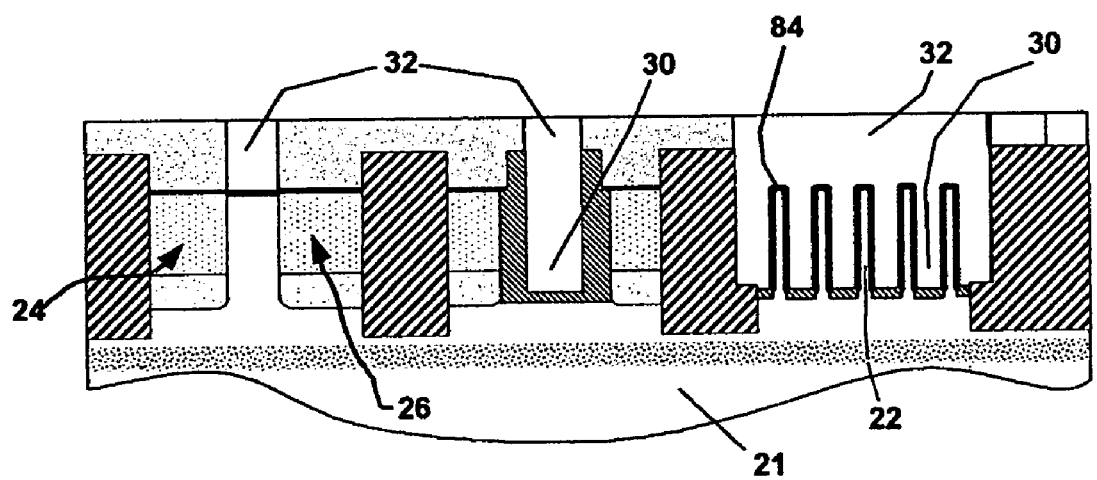
FIG. 27 is a sectional view of illustrating completion of the processing steps in forming the second embodiment of the present invention.
Figure 28:
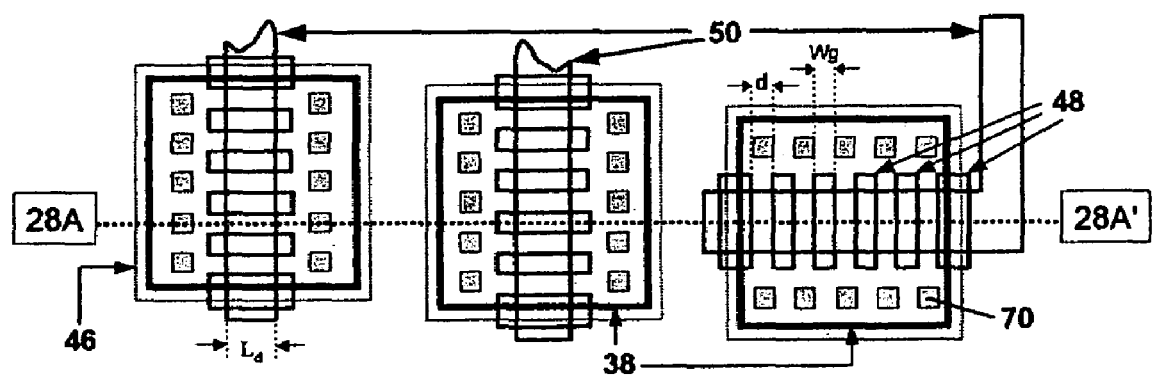
FIG. 28 is a top view of the final form resulting from the process in the second embodiment of the present invention illustrating two similar orientations and one orientation 90° relative to the first two orientations to illustrate the complete final structure of this embodiment.
Figure 28A:
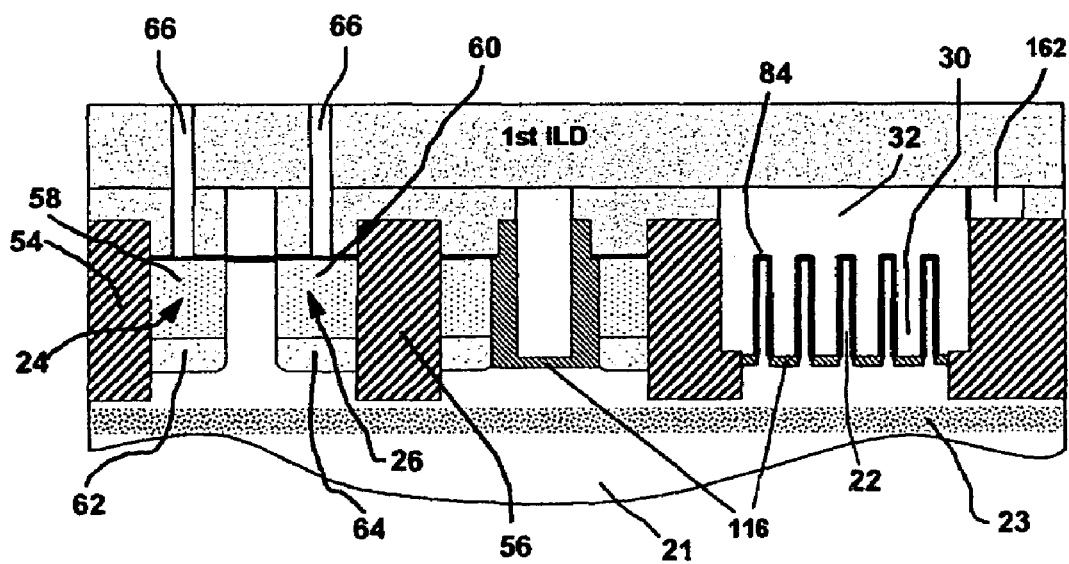
FIG. 28A is a cross-sectional view taken substantially along line 28A-28A of FIG. 28.
Figure 29:
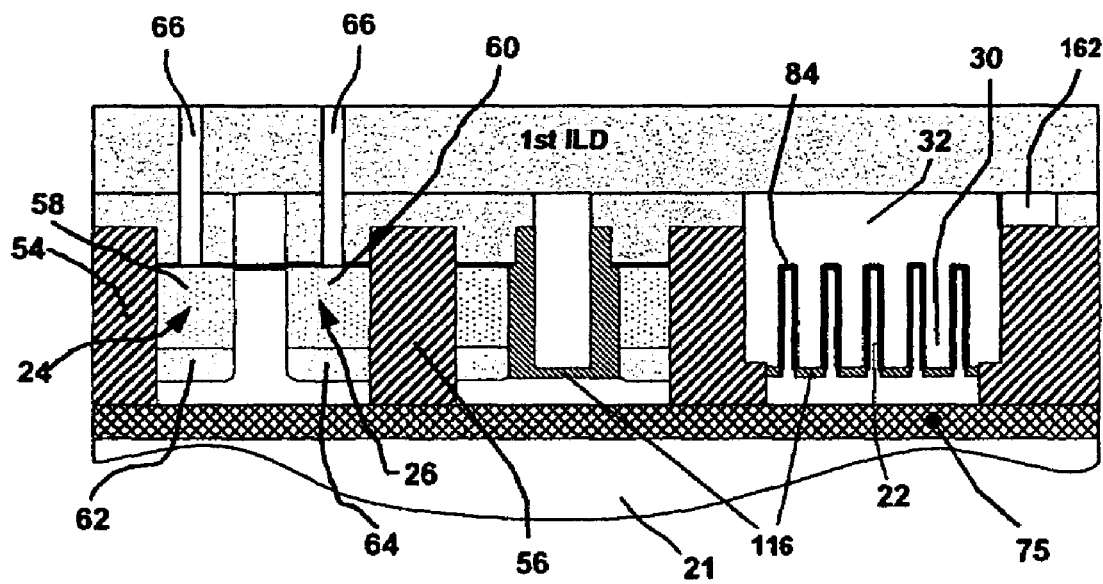
FIG. 29 is a cross-sectional view similar to that of FIG. 28A-28A wherein an SOI wafer is used as a starting substrate.
Figure 30:
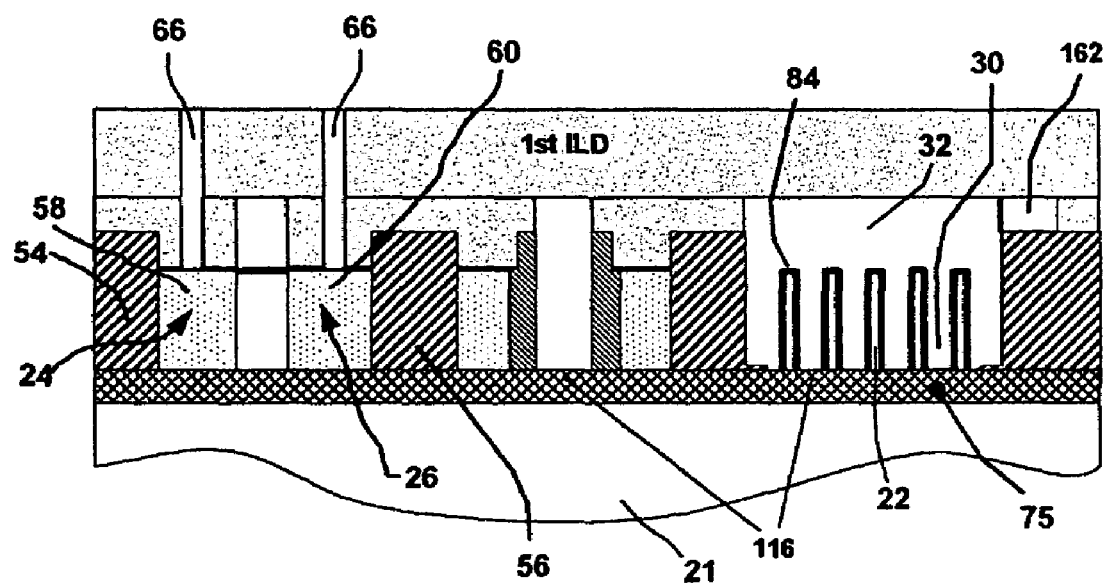
FIG. 30 is a cross-sectional view similar to that of FIG. 28A-28A wherein the gate slot trenches extend all the way to the buried oxide layer.

The structure shown in FIG. 27 represents the completion of the innovative steps of the second embodiment of the disclosed invention. Subsequent processing, such as block 148 of FIG. 22, may now be performed using known VLSI processing techniques to provide contacts and wiring to form circuits. The final device structure is shown in FIG. 28-28A. As was the case for the first embodiment of the disclosed device invention, if an SOI wafer is used as a starting substrate in the case of the second embodiment, the same process steps summarized in FIG. 22 may be used to create the structure illustrated in FIG. 29. In the special case where the gate slot trenches extend all the way to the buried oxide 74, shown in FIG. 30, the first (y) and second (z) predetermined depths are the same, and $T_{bot}$ is now the thickness of the buried oxide ($T_{box}$). The source and drain structure would only be of one conductivity type, which is N-Type in the case of an NMOS device.

Accordingly, two distinct structures and associated fabrication methods have been described for fabricating a castellated gate MOSFET device capable of fully depleted operation (FDCG MOSFET). The device of the invention provides DC drive current per unit area improvements of an order-of-magnitude or greater (10×) as compared to VLSI MOSFET devices presently in existence. In addition, the device of the present invention has a Unity Gain Frequency that is three to five times (3×-5×) greater than existing MOS VLSI I/O devices for a given wafer area. Moreover, the device has enhanced ESD/EOS and reliability characteristics relative to existing MOS VLSI I/O devices for a given wafer area, as well as enabling circuitry with improved/reduced latch-up susceptibility on non-SOI wafers. The vertical-channel/castellated-gate fully-depleted device of the invention has operational characteristics that are symmetrical with respect to the source and drain terminals. The device also provides area-dense VLSI I/O functionality with improved thermal conduction properties from the silicon active area. Finally, from the standpoint of AC or small signal parasitic components, the device of the present invention has reduced equivalent gate resistance and junction capacitance as compared to its planer counterpart for the same drive current.

The foregoing description and the illustrative embodiments of the present invention have been described in detail in varying modifications and alternate embodiments. It should be understood, however, that the foregoing description of the present invention is exemplary only, and that the scope of the present invention is to be limited to the claims as interpreted in view of the prior art. Moreover, the invention illustratively disclosed herein suitably may be practiced in the absence of any element which is not specifically disclosed herein.

I claim

1. A method of manufacturing a fully-depleted castellated-gate MOSFET device comprising the steps of:
creating a starting silicon semiconductor substrate;
applying active layer pad nitride masks to form french isolation islands in said substrate;
forming a plurality of thin silicon channel elements by etching a plurality of spaced gate slots to a first predetermined depth into said substrate;
filling said slots with a dielectric material;
clearing out an area of said dielectric material within said gate slots to form a spacer and bottom gate;
depositing a gate dielectric;
filling said slot regions with a conductive gate material and connecting them together at their upper end surfaces with a top gate layer; and
implanting a source and a drain region at opposite end portions of said spaced, channel elements.

2. The method as claimed in claim 1, wherein said method further includes the step of laying out contact masks as to be directly in-line with said conductive channel elements to provide reduced device series resistance to enhance device performance.

3. The method as claimed in claim 1, wherein said semiconductor substrate comprises a silicon-on-insulator wafer, and wherein said spaced gate slots are etched to the same depth as said shallow Wench isolation islands and all the way to said buried insulator layer.

4. The method as claimed in claim 1, wherein said silicon substrate is doped with a first conductivity type, and wherein said source and drain regions are each separated into an upper portion doped with a second conductivity type and a lower portion doped with said first conductivity type but at a substantially higher concentration level than the first conductivity type dopant concentration in said substrate.

5. The method as claimed in claim 1, wherein the step of forming said silicon channel elements includes the application of two outer-most gate-slot mask shapes spanning both sides of the active region as defined by the active layer mask in order to eliminate leakage and maintain fully-depleted operation in the two outer-most silicon channels elements.

6. The method as claimed in claim 1, wherein said first predetermined depth of said gate slots is less than the depth of said shallow trench isolation islands, and wherein said gate slot trenches are filled with an oxide dielectric, planarized and then re-etched to a second predetermined depth which is less than said first predetermined depth, simultaneously forming a thick bottom gate oxide and spacers between a gate conductor, which will fill said gate slots and said source and drain regions.

7. The method as claimed in claim 6, wherein said oxide dielectric material used to fill the gate slots, and later partially removed, is selected from a group consisting of silicon dioxide, CVD diamond, oxynitride (ONO), and silicon nitride.

8. The method as claimed in claim 6, wherein said first and second predetermined depths may both fall within a range of 250 to 1200 nanometers.

9. The method as claimed in claim 1, wherein outermost gate slot masks are provided to form the outermost gate conductor elements which simultaneously penetrate into both said silicon substrate and bounding shallow trench isolation islands.

10. The method as claimed in claim 1, wherein said device is a dual-gate device, and wherein a nitride cap may reside on top of said conducting elements thereby shutting off said top gate layer.

11. The method as claimed in claim 1, wherein contacts are provided to said source and drain regions coincident with the upper surface of said silicon substrate to result in higher series resistance by applying contact masks as to be directly in-line with said conductive channel elements.

12. A method of manufacturing a filly-depleted castellated-gate MOSFET device comprising the steps of:
creating a starting silicon semiconductor substrate;
applying active layer pad nitride masks to form shallow trench isolation islands in said substrate;
removing said nitride masks using hot phosphoric acid;
forming a plurality of thin silicon channel elements by etching a plurality of spaced gate slots to a first predetermined depth into the substrate;
planarizing the upper surface of said substrate by utilizing said pad nitride layer as a CMP etch stop;
depositing a thin linear dielectric oxide to fill said patterned gate slots;
clearing out an area of said dielectric material within said gate slots to form a spacer and bottom gate;
depositing a gate dielectric;
filling said slot regions with a conductive gate material and connecting them together at their upper end surfaces with a top gate layer; and
implanting a source and a drain region at opposite end portions of said spaced, channel pillars.

13. The method as claimed in claim 12, wherein gate slot masks are provided to overlap a gate mask in the direction of channel element length, with the amount of the overlap representing the spacer and wherein said gate mask overlaps said gate slot masks by a predetermined distance in the direction of the width of said device orthogonal to the channel element length.

14. The method as claimed in claim 12, wherein said device comprises an NMOS device, wherein said silicon semiconductor substrate comprises a silicon-on-insulator starting substrate, wherein said buried oxide layer abuts the bottom of said substrate and said shallow trench isolation islands, and wherein said gate slots are etched to the same depth as said shallow trench isolation islands.

15. The method as claimed in claim 12, wherein an additional low energy implant is performed to further increase the threshold of the bottom single-gate parasitic device.

16. The method as claimed in claim 12, wherein said gate dielectric layer has a thickness in the range of 70 to 150 angstroms in order to support operating voltages in the range of 2.5 to 5.0 volts.

17. The method as claimed in claim 12, wherein after the formation of said gate dielectric, a gate stack is deposed consisting of a gate conductor, an oxide which serves as an etch stop, and a silicon nitride cap, said silicon nitride having significant ion-implant stopping power as the result of its higher material density which enables the self-aligned source and drain implants to be performed without counter-doping non-metal gate materials or the device channel itself.

18. The method as claimed in claim 12, wherein a light oxidizing anneal is performed when said gate conductor is a non-metal to passivate exposed silicon areas with a thin oxide as well as to consume any stringers that may result from said etch process.

19. The method as claimed in claim 12, wherein said source and drain regions are relatively deep and necessitates the step of applying a gate capping layer in order to prevent counter-doping of said top gate layer and the channel elements under said gate.

20. A method of manufacturing a fully-depleted castellated-gate MOSFET device comprising the steps of:
creating a starting silicon semiconductor substrate;
applying active layer pad nitride masks to form shallow trench isolation islands in said substrate;
removing said nitride masks using hot phosphoric acid;
forming a plurality of thin silicon channel elements by etching a plurality of spaced gate slots to a first predetermined depth into the substrate;
planarizing the upper surface of said substrate by utilizing said pad nitride layer as a CMP etch stop;
depositing a thin linear dielectric oxide to fill said patterned gate slots;
forming a dummy gate structure by depositing and patterning a film material;
implanting source and drain regions that are consequently self-aligned by said dummy gate structure;
forming a planarized interlevel dielectric layer by depositing an oxide and etching it back using said dummy gate structure as a CMP etch stop;
removing said dummy gate structure and underlying area of said dielectric material within said gate slots to form a spacer and bottom gate;
forming vertical gate elements by depositing a conductive gate material over said planarized interlevel dielectric layer to fill the opened areas of said slot regions; and
forming a planarized conducting strap which connects said vertical gate elements together at their upper end surfaces by using CMP to etch back upper surface of said conductive gate material to be coincident with upper surface of said interlevel dielectric layer.

21. The method as claimed in claim 20, wherein after the deposition of said linear dielectric which has filled said patterned gate slots, a dummy gate stack is deposed and comprises polysilicon, an oxide which serves as an etch stop, and a silicon nitride cap, said silicon nitride having significant ion-implant stopping power as the result of its higher material density to enable the self-aligned source and drain implants to be performed without counter-doping.

22. The method as claimed in claim 20, wherein a light oxidizing anneal is performed when said dummy gate stack contains a bottom layer of polysilicon to consume any stringers that may result from said patterning process.

* * * * *